(12) United States Patent
Kurokawa

(10) Patent No.: US 8,314,642 B2
(45) Date of Patent: Nov. 20, 2012

(54) PULSE WIDTH ADJUSTING CIRCUIT

(75) Inventor: Fujio Kurokawa, Nagasaki (JP)

(73) Assignee: Nagasaki University, Nagasaki-Shi, Nagasaki (JP)

( * ) Notice: Subject to any disclaimer, the term of this patent is extended or adjusted under 35 U.S.C. 154(b) by 73 days.

(21) Appl. No.: 12/666,780

(22) PCT Filed: Jun. 1, 2008

(86) PCT No.: PCT/JP2008/060086
§ 371 (c)(1),
(2), (4) Date: Jun. 8, 2010

(87) PCT Pub. No.: WO2009/001653
PCT Pub. Date: Dec. 31, 2008

(65) Prior Publication Data
US 2010/0271096 A1    Oct. 28, 2010

(30) Foreign Application Priority Data

Jun. 25, 2007  (JP) .................................. 2007-166389
Aug. 1, 2007   (JP) .................................. 2007-201390

(51) Int. Cl.
*H03K 3/017*   (2006.01)
*H03K 5/04*    (2006.01)
*H03K 7/08*    (2006.01)

(52) U.S. Cl. ......... 327/175; 327/172; 327/291; 327/299
(58) Field of Classification Search .................. 327/115, 327/175, 291, 299
See application file for complete search history.

(56) References Cited

U.S. PATENT DOCUMENTS

| 7,075,353 | B1 * | 7/2006 | Wan et al. ..................... 327/295 |
| 2008/0143408 | A1 * | 6/2008 | Paillet et al. ................. 327/175 |

FOREIGN PATENT DOCUMENTS

| JP | 4-151968 A | 5/1992 |
| JP | 8-330916 A | 12/1996 |

* cited by examiner

*Primary Examiner* — John Poos
(74) *Attorney, Agent, or Firm* — Kile Park Goekjian Reed & McManus PLLC

(57) ABSTRACT

A rising edge or a falling edge is finely adjusted, or a dead time and a period are adjusted with high accuracy. A waveform processing circuit includes: an integration circuit 11 receiving a rectangular or substantially-rectangular pulse and outputting a gradually increasing or decreasing signal obtained by integrating the pulse signal; a reference signal output circuit 12 outputting a constant value or a varying value as a reference signal; and a comparison circuit 13 comparing the output of the integration circuit with the output of the reference signal output circuit and outputting a pulse rising or falling at a timing when the difference between the outputs varies.

8 Claims, 28 Drawing Sheets

1: WAVEFORM PROCESSING CIRCUIT

PULSE WIDTH ADJUSTING CIRCUIT

TECHNICAL FIELD

The present invention relates to a waveform processing circuit which can finely adjust a rising edge or a falling edge (setting an ON or OFF time width of a pulse at a frequency higher than that of an oscillation circuit), or can adjust a dead time and a period with high accuracy.

BACKGROUND ART

Conventionally, in an apparatus containing with a PWM function and an apparatus processing pulses such as VCO, there has been attempted to set timing of ON width, OFF width, duty ratio, dead time, or time width such as period of the pulse with accuracy finer than that of the oscillation period of a transmitter circuit. As for this kind of technique, for example, a technique has been known in which a rising timing of the pulse is shifted using an RC integration circuit as shown in FIG. 27(A).

Specifically, as shown in FIG. 27(B), a capacitor C is charged before one period $T_S$ of a pulse signal starts (before a predetermined time of the rising timing of the pulse), and when the charging voltage $V_{BIAS}$ reaches a threshold voltage $V_{TH}$ ($T_a$), the rising timing of the pulse is set (starting of $T_{ON}$ period). In the technique, as shown in FIG. 27(C), the start timing Ta of the $T_{ON}$ period can be adjusted with high accuracy of a clock CLK (see FIG. 27(B)) by changing the charging voltage $V_{BIAS}$ of the capacitor C.

DISCLOSURE OF THE INVENTION

Problem to be Solved by the Invention

However, since the circuit shown in FIG. 27(A) cannot generate a timing signal with high accuracy because the charging voltage of the capacitor C cannot be constantly maintained, the timing signal cannot be generated with high accuracy.

On the other hand, there may be considered a circuit of which resolution accuracy is artificially increased by interpolating and expanding the number of bits. The circuit includes an A/D converter 91, an interpolation expander 92, a D/A converter 93, and a comparator 94. The number of bits of the signal (8 bits in this example) from the A/D converter 91 is expanded (10 bits expansion in this example) by an interpolation expander 92. The 10-bit signal which is interpolated and expanded is converted into an analog signal $V_A$ by the D/A converter 93, and compared with a saw signal $V_{SAW}$ by the comparator 94 which outputs a PWM-modulated pulse signal $S_{PWM}$. FIG. 28(B) shows the analog signal $V_A$, the saw signal $V_{SAW}$, and the pulse signal $S_{PWM}$. However, in the scheme, since the comparator of the analog saw signal is used, it is susceptible to noise.

An object of the invention is to provide a waveform processing circuit which can finely adjust a rising edge or a falling edge of a pulse (setting an ON or OFF time width of a pulse with resolution accuracy higher than that of an oscillation circuit), or can adjust a dead time and a period with high accuracy.

Means for Solving the Problem

The gist of the waveform processing circuit according to the invention is the following configurations (1) to (9).

(1) A waveform processing circuit comprising:
an integration circuit receiving a rectangular or substantially-rectangular pulse and outputting a gradually increasing or decreasing signal obtained by integrating the pulse signal;
a reference (analog) signal output circuit outputting a constant value or a varying value as a reference signal; and
a comparison circuit comparing the output of the integration circuit with the output of the reference signal output circuit and outputting a pulse rising or falling at timing when the difference between the outputs varies.

In the invention, the pulse width can be finely adjusted by (1) delaying the rising timing of the pulse, (2) advancing the rising timing of the pulse, or (3) delaying the rising timing of the pulse, and advancing the rising timing of the pulse.

A PWM signal generating counter can be provided at the back-stage (for example, a drive signal generating circuit of a power converter) of the waveform processing circuit according to the invention, and a rising timing of a carry signal of the counter can be finely delayed and/or a falling timing thereof can be finely advanced.

In the waveform processing circuit according to the invention, a coarse timing generating counter (coarse accuracy counter) can be provided at the front-stage (or the back-stage) of the integration circuit. By using the carry signal of the counter, a coarse timing (timing with accuracy of a reference clock) is generated, and by using the integration circuit, the reference signal output circuit, and the comparison circuit, a fine timing (timing with accuracy higher than that of the reference clock) can be generated.

In the invention, the integration circuit can be charged by a reference voltage Vref. In this case, it can be configured such that the charging of the integration circuit by the reference voltage Vref can start by the carry signal of the coarse accuracy counter (a switch is configured to be provided between the terminal of the reference voltage and the input terminal of the integration circuit so as to be switched).

In addition, the coarse accuracy counter and a flip-flop which receives the carry signal from the counter and the reference clock can be provided at the front-stage of the integration circuit.

(2) The waveform processing circuit according to (1), wherein the reference signal output circuit includes a D/A converter and a low-pass filter is further provided at the subsequent stage of the D/A converter.

(3) The waveform processing circuit according to (1) or (2), wherein plural groups of the integration circuit, the reference signal output circuit, and the comparison circuit are provided in parallel and a selection circuit is provided at the subsequent stage of the comparison circuit.

(4) The waveform processing circuit according to (1) or (2), wherein plural groups of the integration circuit, the reference signal output circuit, and the comparison circuit are provided in series.

(5) The waveform processing circuit according to (1) or (2), wherein the integration circuit includes plural integration circuit elements and a selection circuit selecting the outputs of the integration circuit elements, and/or
wherein the reference signal output circuit includes plural reference signal output circuit elements and a selection circuit selecting the outputs of the reference signal output circuit elements.

(6) The waveform processing circuit according to (1) or (2), wherein a plural number of the integration circuits is provided and the comparison circuit is provided on the output sides of the integration circuits, and wherein the plural comparison circuits compare the outputs of the plural integration circuits and the reference signal output circuit with each other.

(7) The waveform processing circuit according to (1) or (2), wherein a plural number of the reference signal output circuits is provided and the comparison circuit is provided on the output sides of the reference signal output circuits, and wherein the plural comparison circuits compare the outputs of the plural reference signal output circuits and the integration circuit with each other.

(8) The waveform processing circuit according to any one of (1) to (7), wherein an output stage is provided with a waveform generating circuit synthesizing the rectangular or substantially-rectangular pulse signal and the output signal of the comparison circuit.

(9) The waveform processing circuit according to any one of (1) to (8), wherein a counter circuit is further provided at the previous stage or the subsequent stage of the waveform generating circuit, and wherein a pulse signal of a frequency lower than that of the pulse signal is generated and a turning-on and/or turning-off timing signal of a processing pulse is generated.

The selection circuit or the waveform generating circuit described above can receive a signal input to the integration circuit (for example, a signal for driving an operation switch of the integration circuit) or the reference clock.

Advantage of the Invention

A desired waveform can be generated from an input pulse signal and a reference signal, and specifically, it is possible to finely adjust the rising edge or the falling edge of the PWM device or the like (set the ON or Off time width of a pulse with a resolution higher than that of the oscillation circuit) or it is possible to adjust the dead time and the period with high precision.

In the invention, even when the resolution of the D/A converter used for the reference signal is lowered by connecting the integration circuits in series, it is possible to obtain the same advantage as using the D/A converter with a high resolution and to obtain a timing signal with a high resolution, by repeating the generation of timing signal in a rising time gradually shortened via several stages.

That is, a period determined by counting the number of pulses is adjusted such that ON or OFF time width of the pulses is set with resolution finer than the period of oscillation pulse by finely adjusting the rising edge or the falling edge of the pulse. Therefore, the waveform processing circuit capable of adjusting signals with high accuracy can be provided by a simple configuration mixing with digital and analog elements.

BRIEF DESCRIPTION OF THE DRAWINGS

FIG. 1 is a diagram illustrating a waveform processing circuit according to an embodiment of the invention, where

FIG. 13 is a diagram illustrating an example of waveforms of the waveform processing circuit, where

FIG. 14 is a diagram illustrating another examples of waveforms of the waveform processing circuit, where

DESCRIPTION OF REFERENCE NUMERALS AND SIGNS

1: WAVEFORM PROCESSING CIRCUIT
11: INTEGRATION CIRCUIT
12: REFERENCE SIGNAL OUTPUT CIRCUIT
13: COMPARISON CIRCUIT
14: WAVEFORM GENERATING CIRCUIT
121: D/A CONVERTER
122: LOW-PASS FILTER

BEST MODE FOR CARRYING OUT THE INVENTION

Figure 1A:
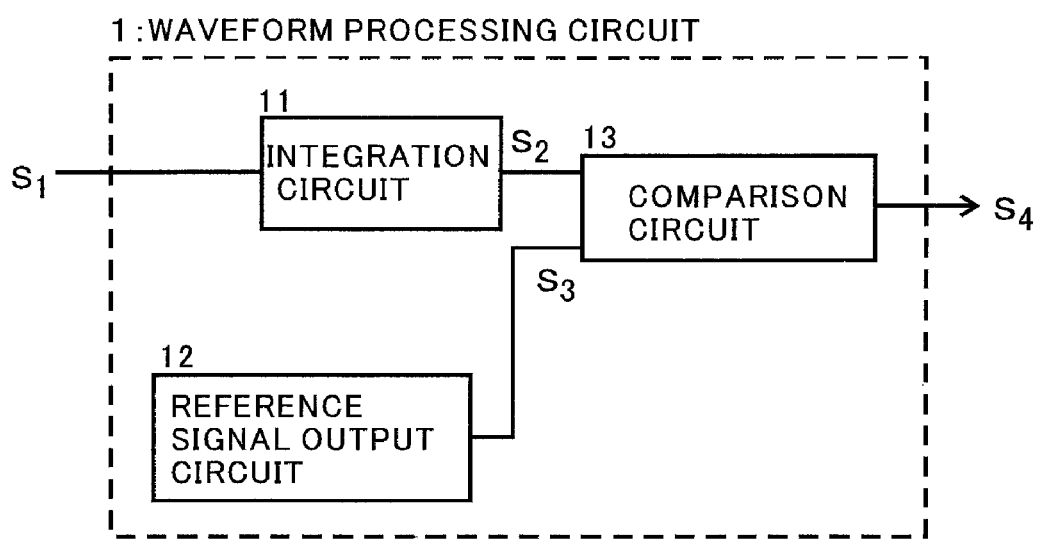
FIG. 1(A) is a diagram illustrating a basic configuration and FIG. 1(B) is a diagram illustrating an example where an integration circuit includes plural elements.

FIG. 1(A) is a diagram illustrating an embodiment of the waveform processing circuit according to the invention. In FIG. 1(A), the waveform processing circuit 1 includes an integration circuit 11, a reference signal output circuit 12, and a comparison circuit 13.

The integration circuit 11 receives a rectangular or substantially-rectangular pulse signal and outputs a gradually increasing or decreasing signal obtained by integrating the pulse signal. The integration circuit 11 may be formed by a circuit (circuit including a capacitor and a resistor) not including an active element or may be formed by a circuit including an active element.

The reference signal output circuit 12 outputs a constant value or a varying value as a reference signal. The reference signal output circuit 12 can be formed by a D/A converter. When the reference signal output circuit 12 outputs a varying value, a low-pass filter may be provided at the subsequent stage of the D/A converter to smooth the output of the D/A converter.

The comparison circuit 13 compares the output of the integration circuit 11 with the output of the reference signal output circuit 12 and outputs a signal obtained by adding a temporal modulation to the rectangular or substantially-rectangular pulse signal.

Figure 1B:
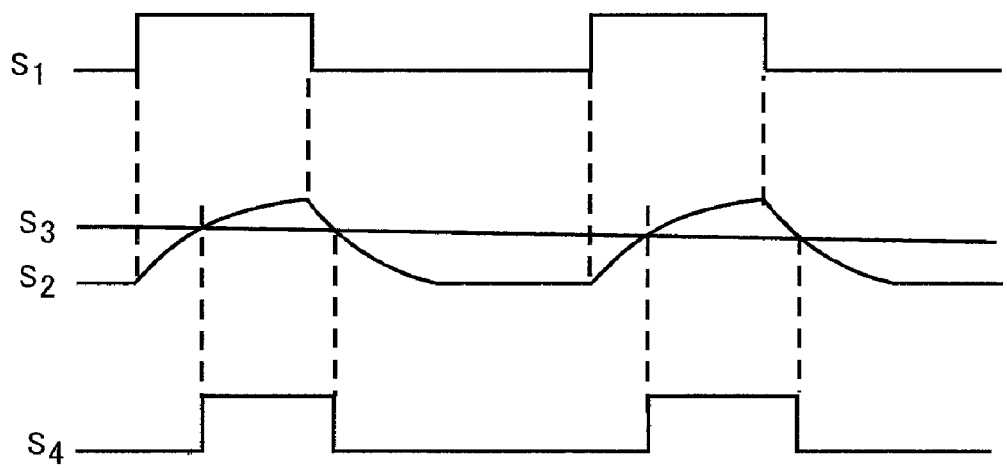

FIG. 1(B) is a diagram illustrating examples of the input $S_1$ of the integration circuit 9 (the input of the waveform processing circuit 1), the output $S_2$ of the integration circuit 11, the output $S_3$ of the reference signal output circuit 12, and the output $S_4$ of the comparison circuit 13.

Further, $S_1$ is typically an output signal (carry signal, etc.) of the counter circuit (a counter or a circuit including a counter).

Figure 2A:
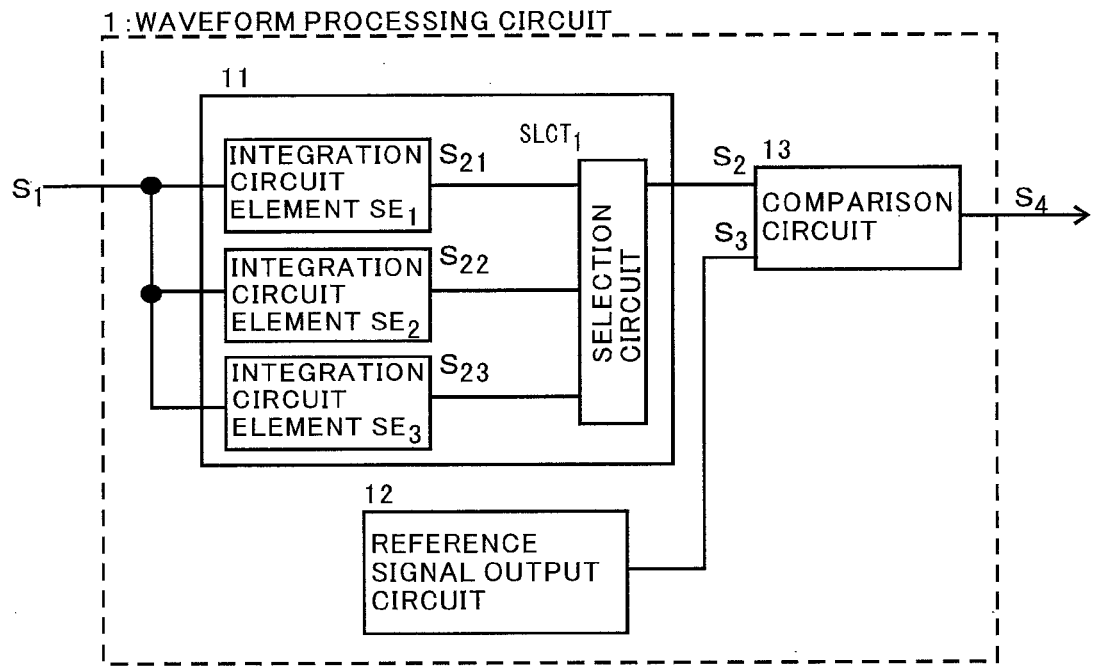
FIG. 2(A) is a diagram illustrating an example where the integration circuit includes three integration circuit elements and a selection circuit and FIG. 2(B) is a diagram illustrating an example where a reference signal output circuit includes three reference signal output circuit elements.

In the waveform processing circuit 1, as shown in FIG. 2(A), the integration circuit 11 may include plural integration circuit elements ($SE_1$, $SE_2$, and $SE_3$ in FIG. 2(A)) and a selection circuit $SLCT_1$.

Figure 2B:
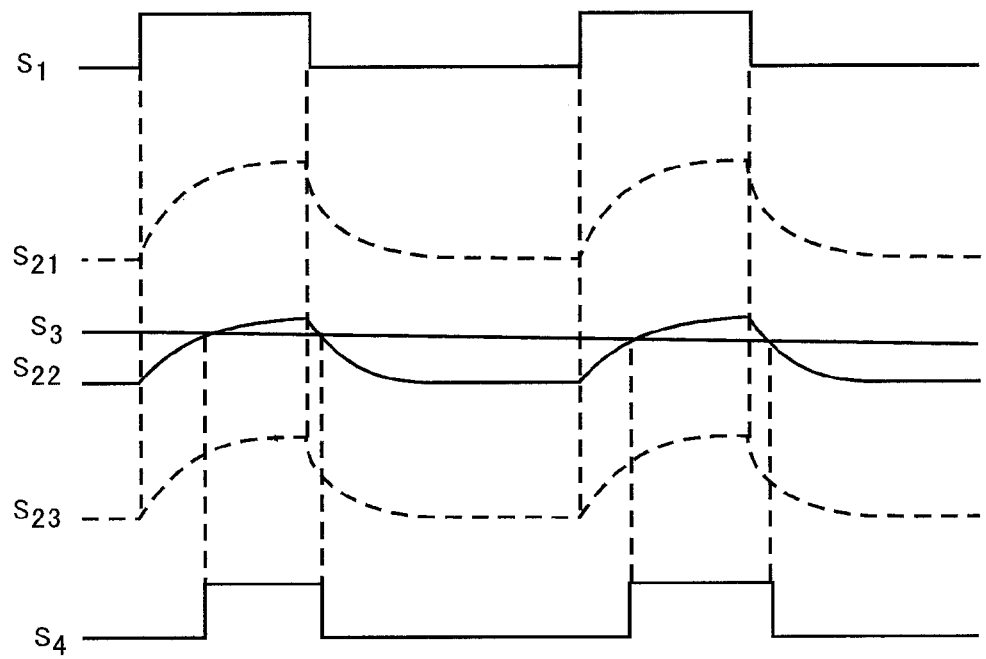

The selection circuit $SLCT_1$ can select one of the integration circuit elements $SE_1$, $SE_2$, and $SE_3$ in accordance with an instruction from a selection controller not shown. FIG. 2(B) shows examples of the input $S_1$ of the waveform processing circuit (the inputs of the integration circuit elements $SE_1$, $SE_2$, and $SE_3$), the outputs $S_{21}$, $S_{22}$, and $S_{23}$ of the integration circuit elements $SE_1$, $SE_2$, and $SE_3$, the output $S_2$ of the selection circuit $SLCT_1$, the output $S_3$ of the reference signal output circuit 12, and the output $S_4$ of the comparison circuit 13.

Figure 3A:
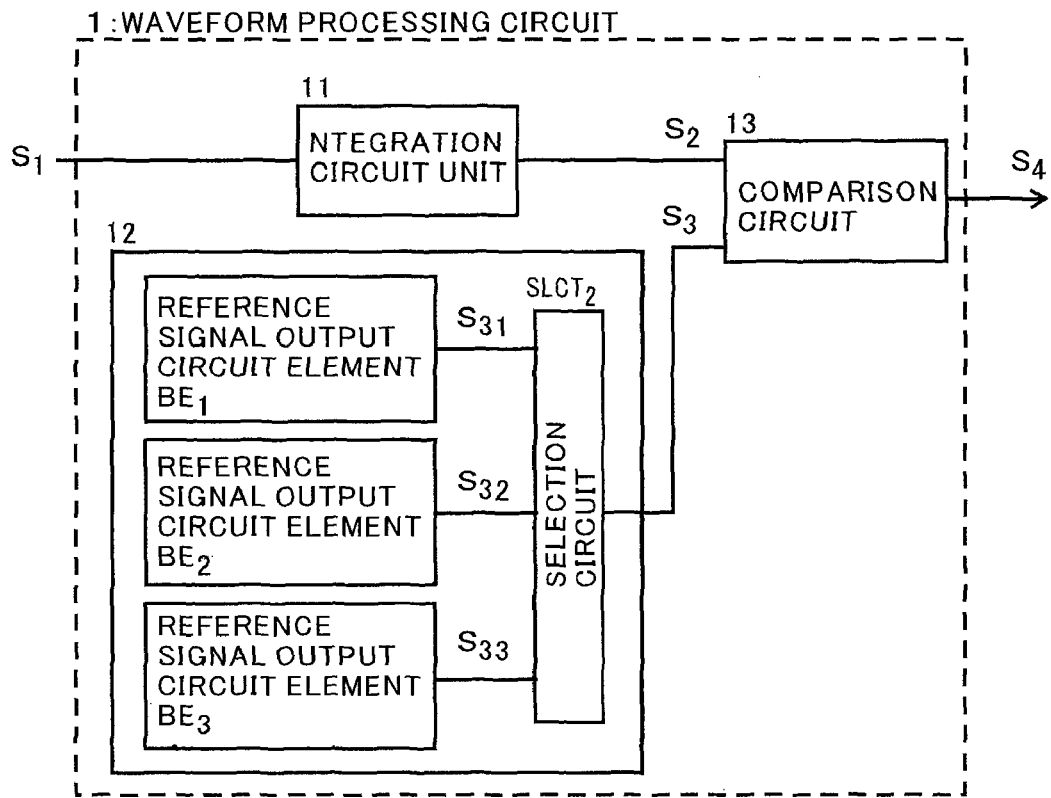
FIG. 3(A) is a diagram illustrating an example (one selection circuit) where the integration circuit includes three integration circuit elements and a selection circuit and the reference signal output circuit includes three reference signal output circuit elements and FIG. 3(B) is a diagram illustrating an example (two selection circuits) where the integration circuit includes three integration circuit elements and a selection circuit and the reference signal output circuit includes three reference signal output circuit elements.
Figure 3B:
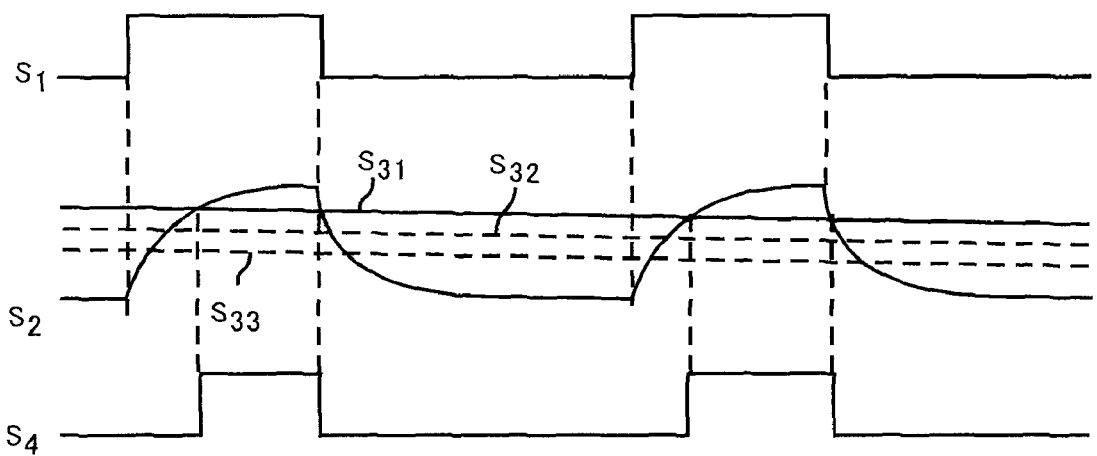

As shown in FIG. 3(A), the reference signal output circuit 12 can include plural reference signal output circuit elements ($BE_1$, $BE_2$, and $BE_3$ in FIG. 3(A)) and a selection circuit $SLCT_2$. FIG. 3(B) shows examples of the input $S_1$ of the waveform processing circuit (the input of the integration circuit), the output $S_2$ of the integration circuit, the outputs $S_{31}$, $S_{32}$, and $S_{33}$ of the reference signal generating circuit elements $BE_1$, $BE_2$, and $BE_3$, the output $S_3$ of the selection circuit $SLCT_2$, and the output $S_4$ of the comparison circuit 13.

Figure 4:
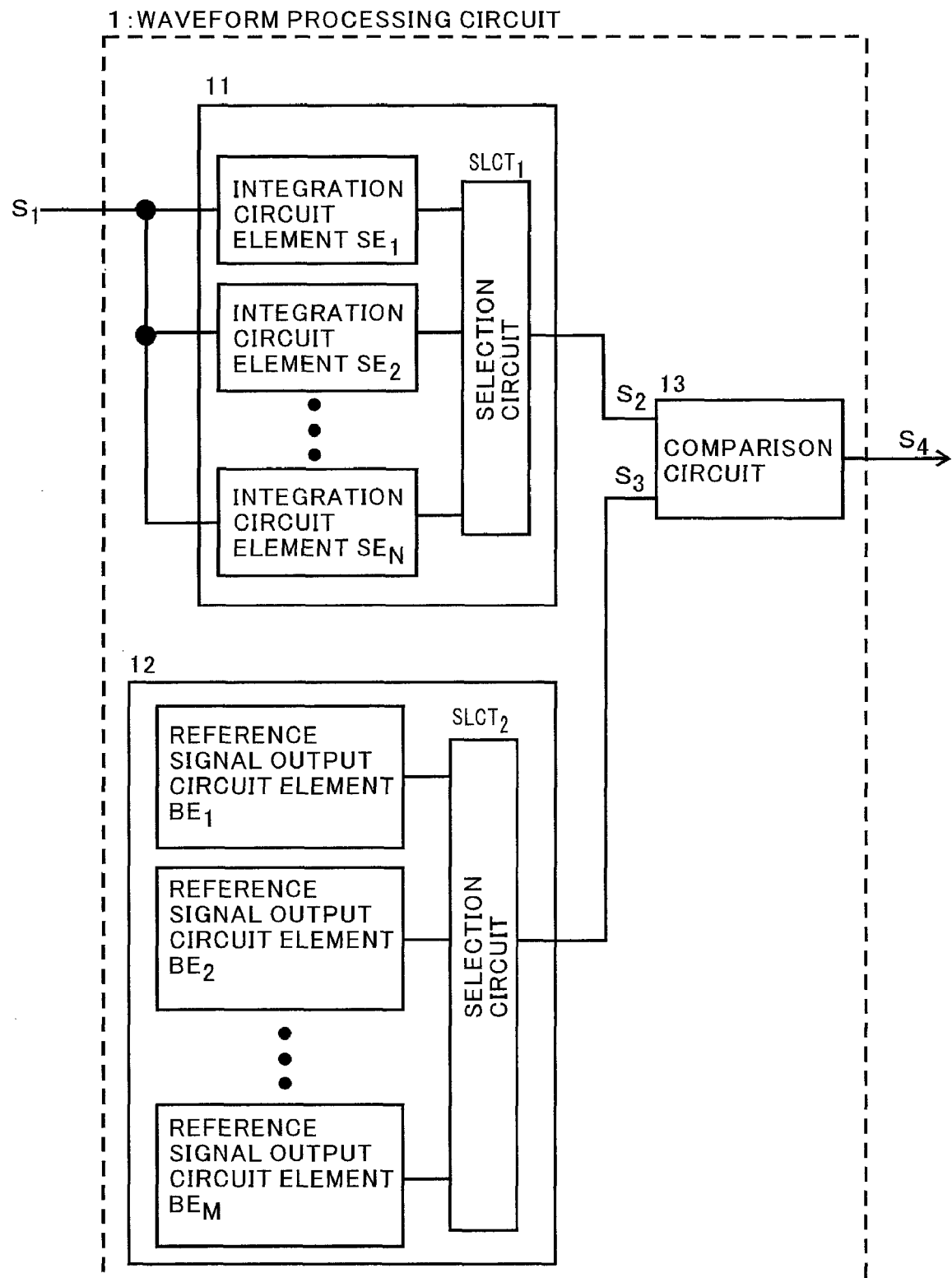
FIG. 4 is a diagram illustrating an embodiment where the integration circuit includes plural integration circuit elements and a comparison circuit includes plural comparison circuit elements.

In the waveform processing circuit 1, as shown in FIG. 4, the integration circuit 11 may include plural integration circuit elements ($SE_1$, $SE_2$, ..., and $SE_M$ in FIG. 4) and a selection circuit $SLCT_1$, and the reference signal output circuit 12 may include plural reference signal output circuit elements ($BE_1$, $BE_2$, ..., and $BE_M$ in FIG. 4) and a selection circuit $SLCT_2$.

Figure 5:
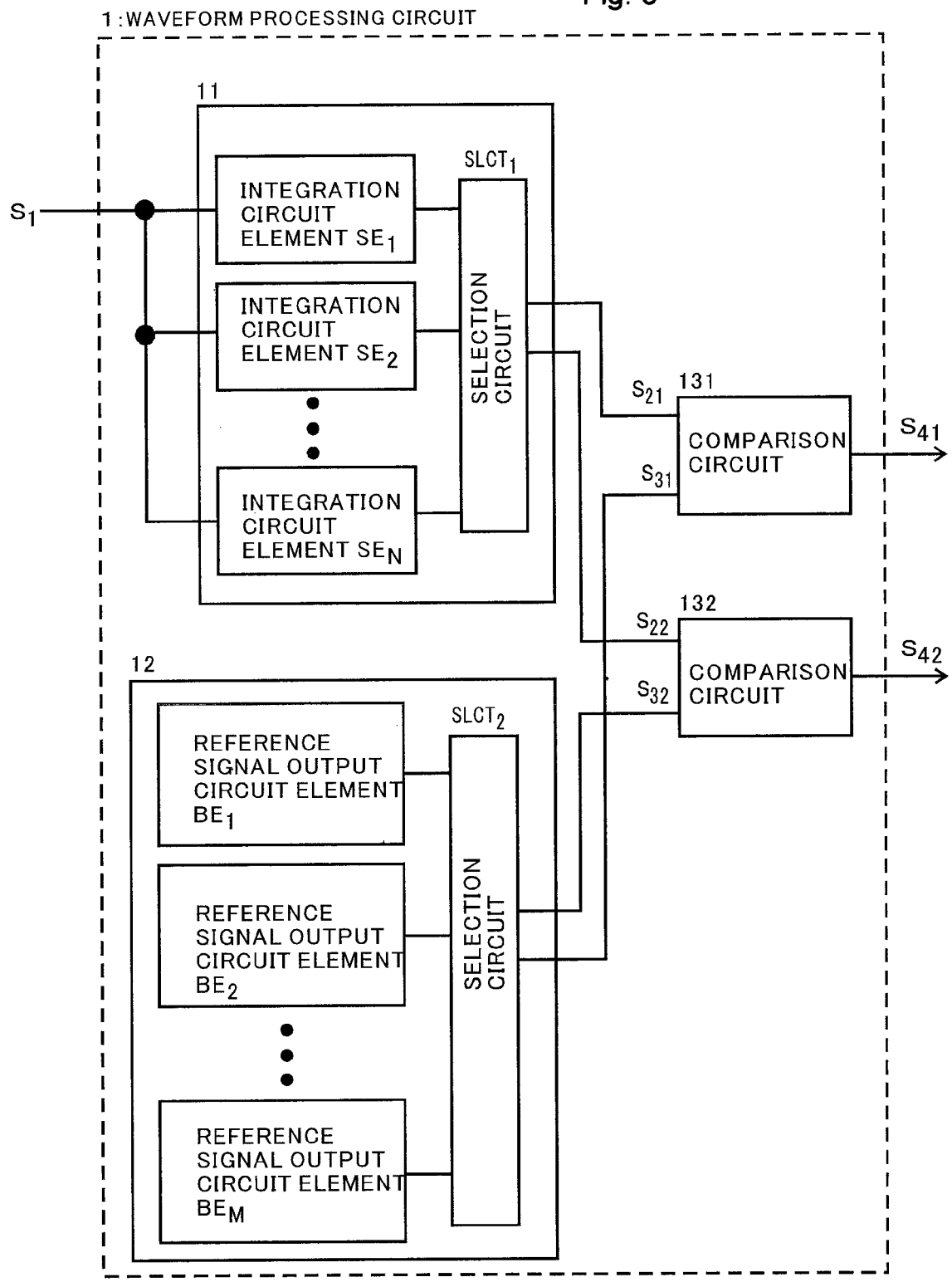
FIG. 5 is a diagram illustrating an example where a waveform generating circuit in the circuit shown in FIG. 4 receives the output of the comparison circuit and synthesizes waveforms.

In the waveform processing circuit 1, as shown in FIG. 5, the integration circuit may include plural integration circuit elements ($SE_1$, $SE_2$, ..., and $SE_M$ in FIG. 5) and a selection circuit $SLCT_1$ receiving signals therefrom and outputting plural signals (two signals $S_{21}$ and $S_{22}$ in FIG. 5).

The reference signal output circuit 12 may include plural reference signal output circuit elements ($BE_1$, $BE_2$, ..., and $BE_M$ in FIG. 5) and a selection circuit $SLCT_2$ outputting plural signals (two signals $S_{31}$ and $S_{32}$ in FIG. 5), and the comparison circuit 13 may include plural comparison circuit elements (represented by reference signs $CE_1$ and $CE_2$ in FIG. 3(B)). Here, the comparison circuit 13 may include a comparison circuit element $CE_1$ receiving one $S_{21}$ of two signals from the integration circuit 11 and one $S_{31}$ of two signals from the reference signal output circuit 12 and a comparison circuit element $CE_2$ receiving the other $S_{22}$ of two signals from the integration circuit 11 and the other $S_{32}$ of two signals from the reference signal output circuit 12.

In FIGS. 2 and 3, one of the integration circuit 11 and the reference signal output circuit 12 includes a selection circuit ($SLCT_1$ in FIG. 2 and $SLCT_2$ in FIG. 3). In FIGS. 4 and 5, both the integration circuit 11 and the reference signal output circuit 12 include the selection circuits $SLCT_1$ and $SLCT_2$, respectively. However, in the invention, as shown in FIGS. 6 to 11, the integration circuit 11 and the reference signal output circuit 12 may not include the selection circuit at all.

Figure 6:
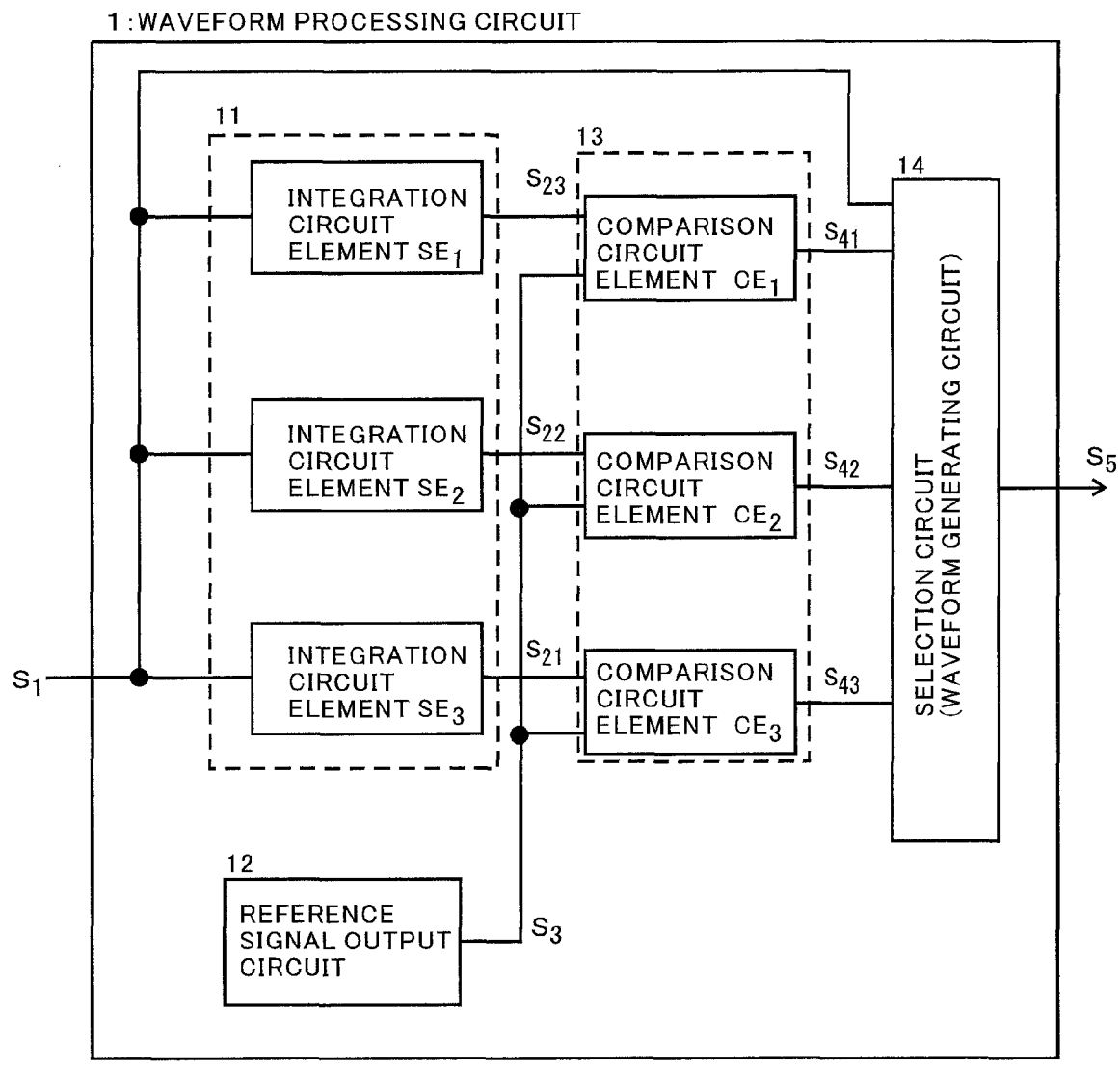
FIG. 6 is a diagram illustrating an embodiment where the integration circuit includes plural integration circuit elements and the comparison circuit includes plural comparison circuit elements.

FIG. 6 is a diagram illustrating an embodiment where the integration circuit 11 includes plural integration circuit elements and the comparison circuit 13 includes plural comparison circuit elements. In FIG. 6, the integration circuit 11 includes three integration circuit elements $SE_1$, $SE_2$, and $SE_3$ and the comparison circuit 13 includes three comparison circuit elements $CE_1$, $CE_2$, and $CE_3$. The outputs $SE_1$, $SE_2$, and $SE_3$ of the integration circuit elements are input to the comparison circuit elements $CE_1$, $CE_2$, and $CE_3$. The integration circuit elements $SE_1$, $SE_2$, and $SE_3$ having different integral characteristics.

The comparison circuit elements $CE_1$, $CE_2$, and $CE_3$ receive the signal $S_3$ from the reference signal output circuit 12 and output the comparison results (signals $S_{41}$ to $S_{43}$) to the waveform generating circuit 14. The waveform generating circuit 14 receives a pulse signal $S_1$ in addition to the signals $S_{41}$ to $S_{43}$ and synthesizes the waveforms on the basis of the received signals. For example, the waveform generating circuit 14 selects one of the signals $S_{41}$, $S_{42}$, and $S_{43}$ by the use of a built-in selection circuit and generates an output pulse $S_5$ from the selected signal and the pulse signal $S_1$.

Figure 7:
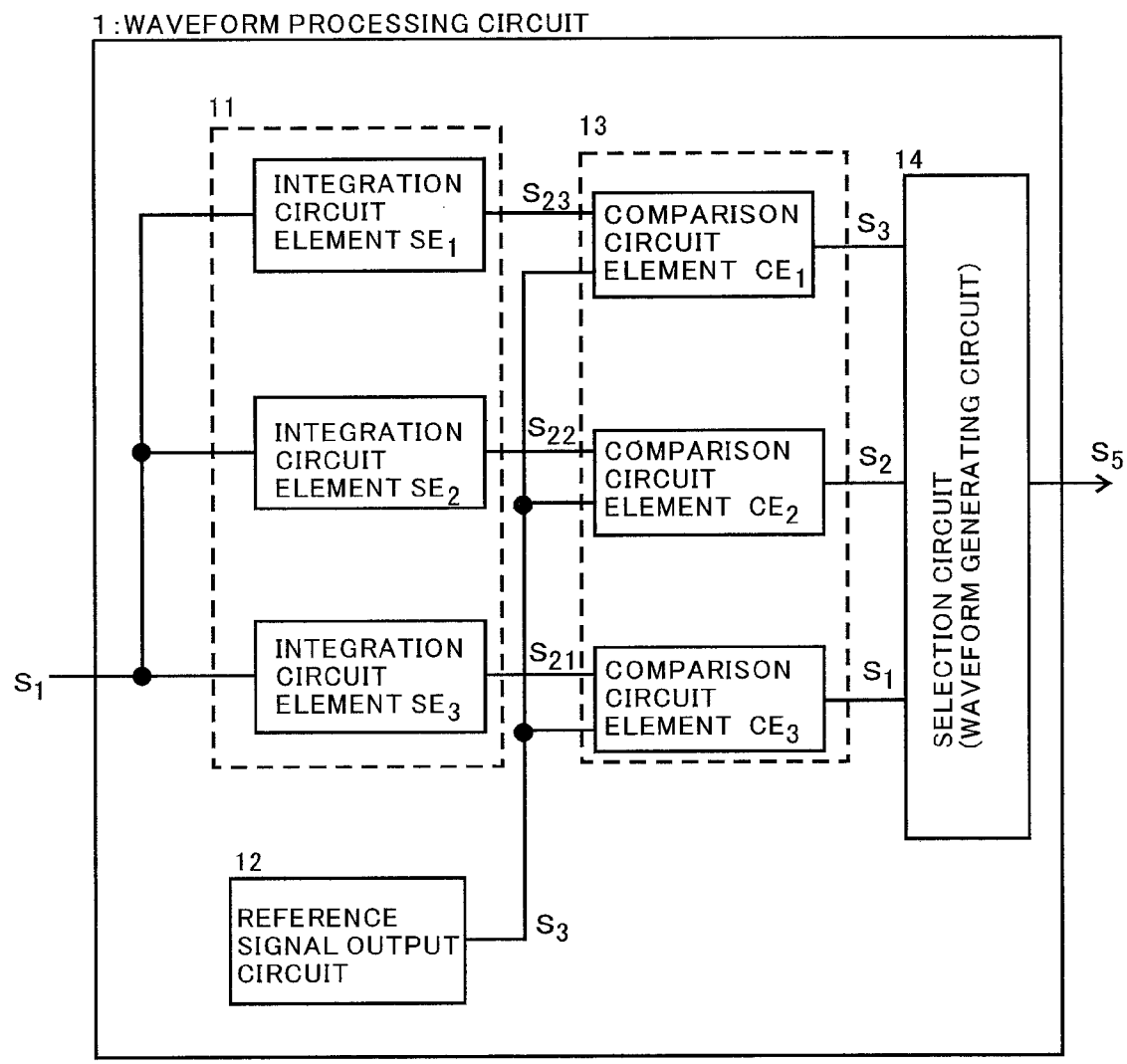
FIG. 7 is a diagram illustrating an example where the waveform generating circuit in the circuit shown in FIG. 6 does not receive a pulse signal but receives the outputs of the comparison circuit elements and synthesizes waveforms.

FIG. 7 shows an example where the waveform generating circuit 14 in the circuit shown in FIG. 6 does not receive the pulse signal $S_1$ but receives the output signals $S_{41}$, $S_{42}$, and $S_{43}$ of the comparison circuit elements $CE_1$, $CE_2$, and $CE_3$ to synthesize the waveforms. In this case, the waveform generating circuit 14 selects two of the signals $S_{41}$, $S_{42}$, and $S_{43}$, for example, by the use of the built-in selection circuit and generate the output pulse $S_5$ from the selected signals.

An example where one of the signals $S_{41}$, $S_{42}$, and $S_{43}$ is selected and the selected signal is synthesized with $S_1$ by the waveform generating circuit 14 is shown in FIG. 6, but one of $S_1$, $S_{41}$, $S_{42}$, and $S_{43}$ may be selected and output, for example, using the selection circuit instead of the waveform generating circuit 14. An example where two of the signals $S_{41}$, $S_{42}$, and $S_{43}$ is selected and the selected signals are synthesized by the waveform generating circuit 14 is shown in FIG. 7, but one of $S_{41}$, $S_{42}$, and $S_{43}$ may be selected and output, for example, using the selection circuit instead of the waveform generating circuit 14.

Figure 8:
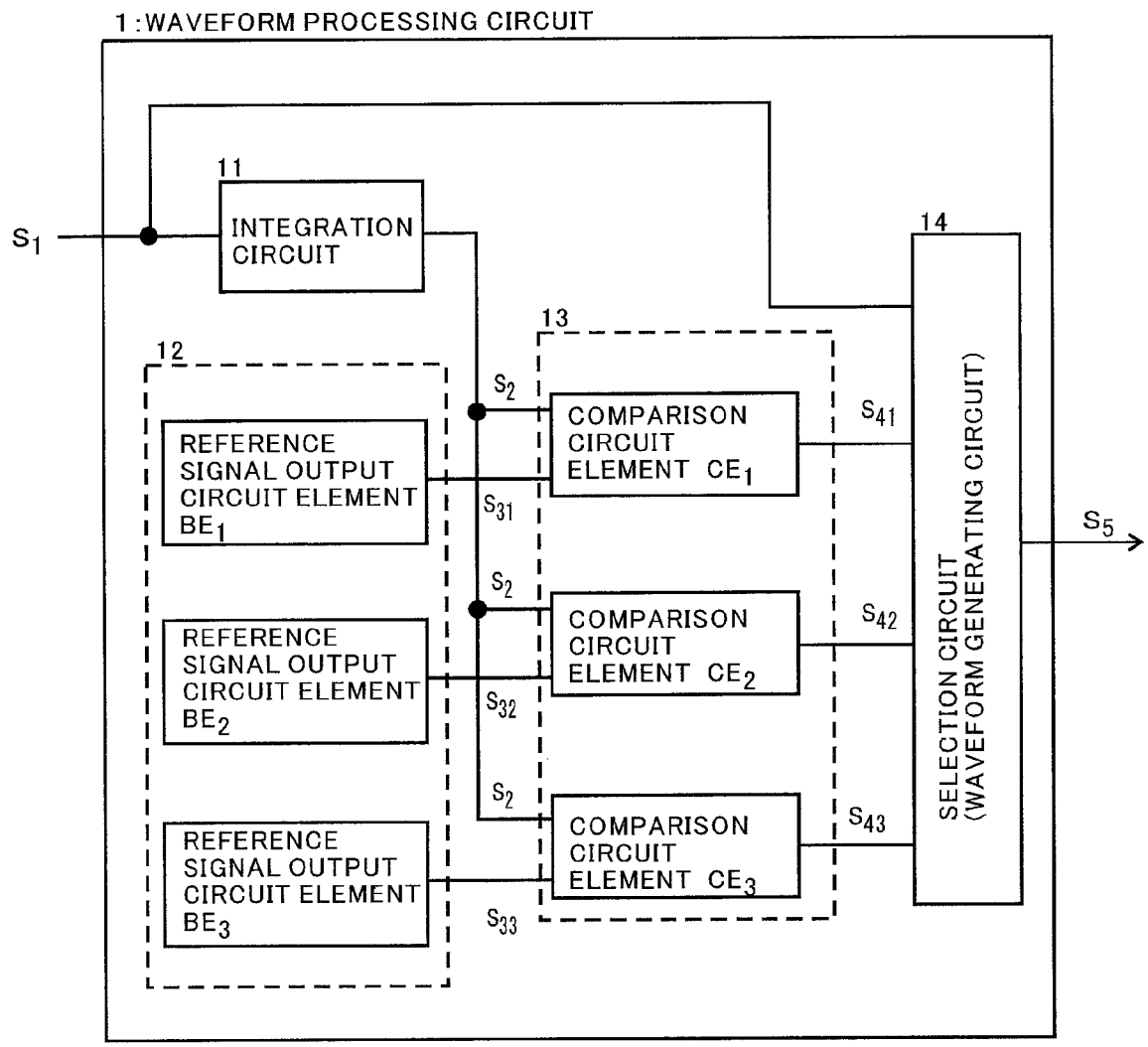
FIG. 8 is a diagram illustrating an embodiment where the reference signal output circuit includes plural reference, signal output circuit elements and the comparison circuit includes plural comparison circuit elements.

FIG. 8 is a diagram illustrating an example where the reference signal output circuit 12 includes plural reference signal output circuit elements and the comparison circuit 13 includes plural comparison circuit elements. In FIG. 8, the number of reference signal output circuit elements and the number of comparison circuit elements are three and the outputs $S_{31}$, $S_{32}$, and $S_{33}$ of the reference signal output circuit elements $BE_1$, $BE_2$, and $BE_3$ are input to the comparison circuit elements $CE_1$, $CE_2$, and $CE_3$. The input and output characteristics of the reference signal output circuit elements $BE_1$, $BE_2$, and $BE_3$ are different from each other.

The comparison circuit elements $CE_1$, $CE_2$, and $CE_3$ receive the signal $S_2$ from the integration circuit 11 and output the comparison results (signals $S_{41}$ to $S_{43}$) to the waveform generating circuit 14. The waveform generating circuit 14 receives the pulse signal $S_1$ in addition to the signals $S_{41}$ to $S_{43}$ and synthesizes the waveforms on the basis of the received signals.

Figure 9:
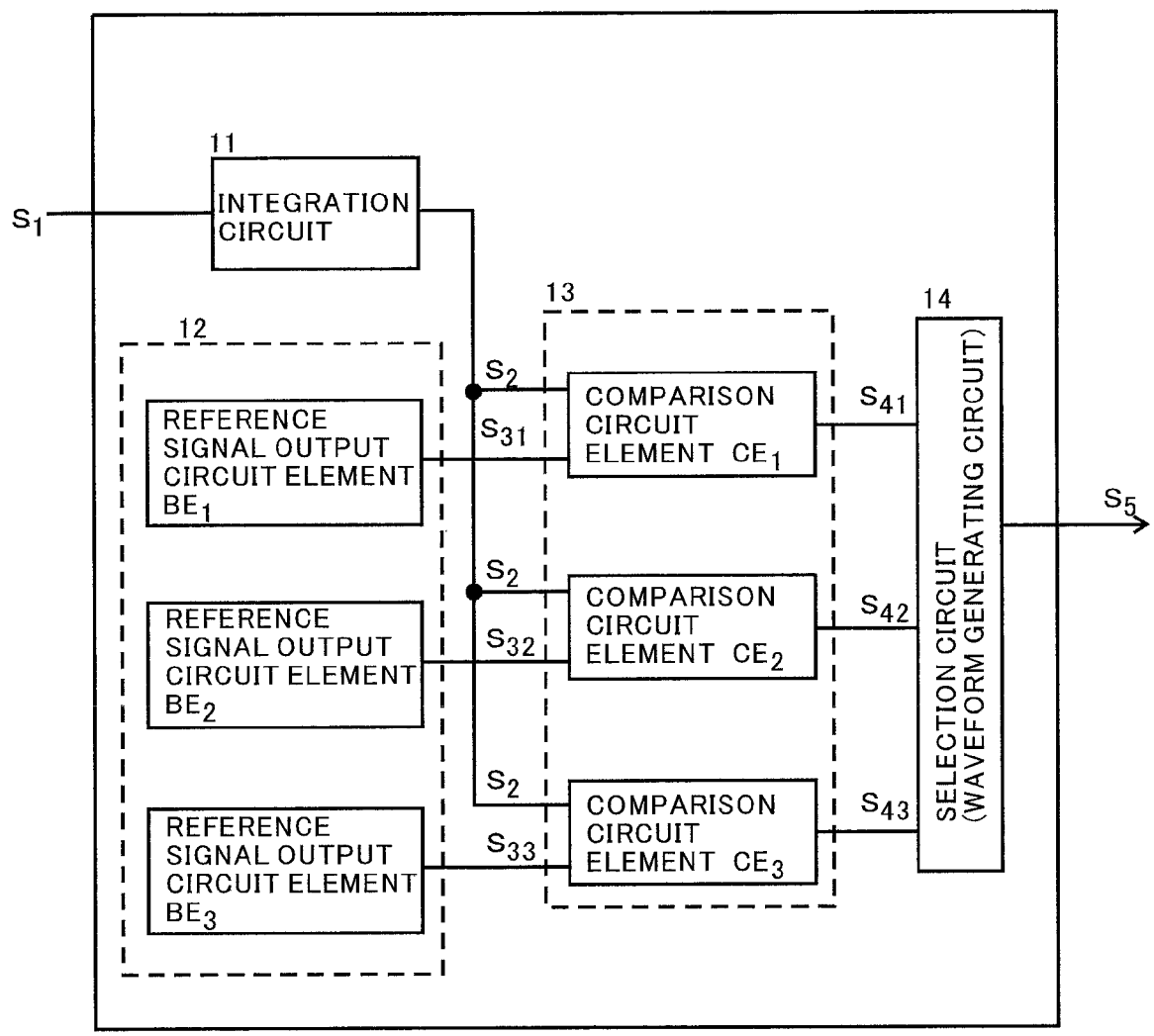
FIG. 9 is a diagram illustrating an example where the waveform generating circuit in the circuit shown in FIG. 8 receives the output of the comparison circuit and synthesizes waveforms.

FIG. 9 shows an example where the waveform generating circuit 14 in the circuit shown in FIG. 8 does not receive the pulse signal $S_1$ but receives the outputs $S_{41}$ to $S_{43}$ of the comparison circuit elements $CE_1$, $CE_2$, and $CE_3$ to synthesize the waveforms.

An example where one of the signals $S_{41}$, $S_{42}$, and $S_{43}$ is selected and the selected signal is synthesized with $S_1$ by the waveform generating circuit 14 is shown in FIG. 8, but one of $S_1$, $S_{41}$, $S_{42}$, and $S_{43}$ may be selected and output, for example, by the use of the selection circuit instead of the waveform generating circuit 14. In addition, an example where two of the signals $S_{41}$, $S_{42}$, and $S_{43}$ are selected and the selected signal is synthesized by the waveform generating circuit 14 is shown in FIG. 9, but one of $S_{41}$, $S_{42}$, and $S_{43}$ may be selected and output, for example, by the use of the selection circuit instead of the waveform generating circuit 14.

Figure 10:
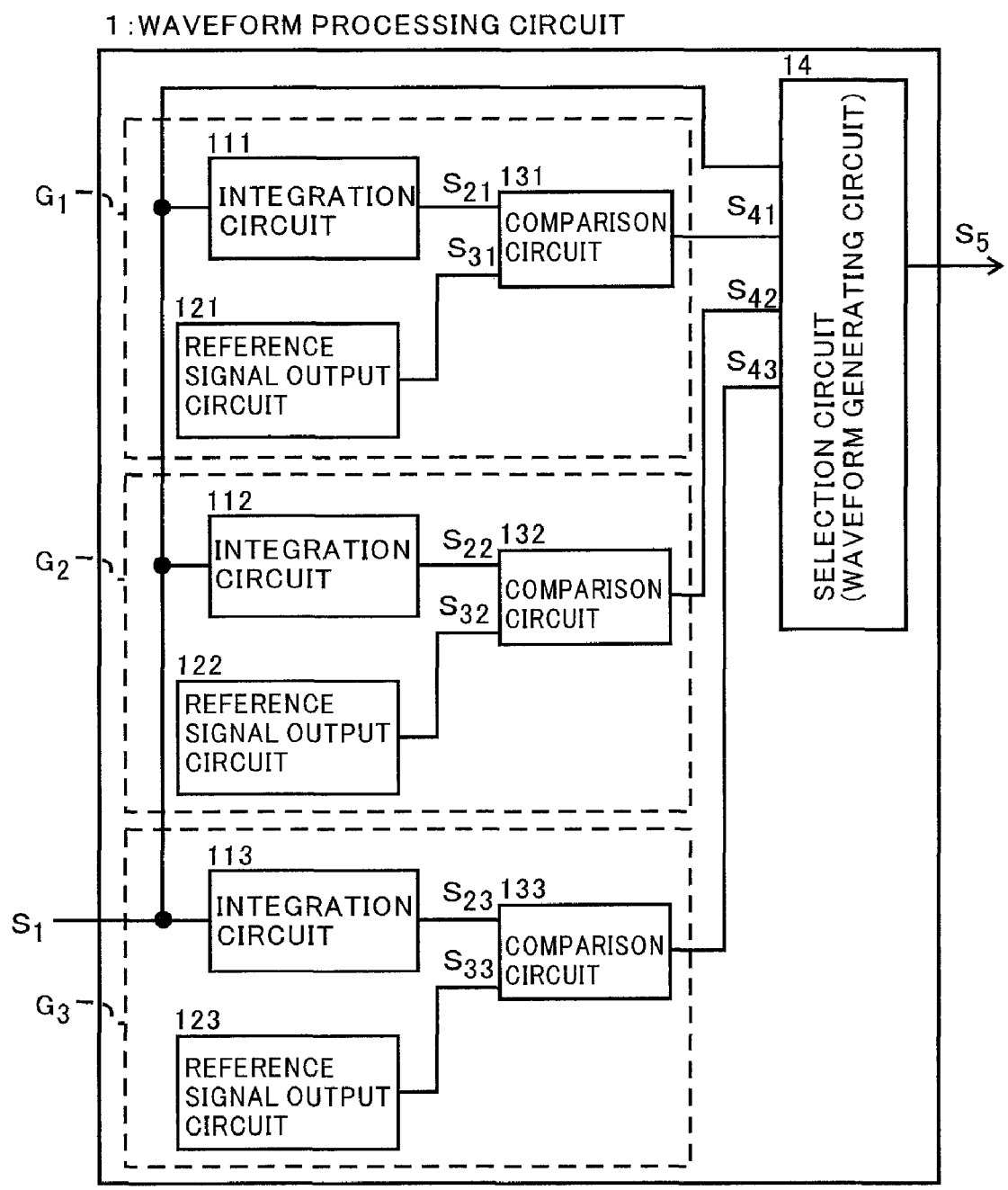
FIG. 10 is a diagram illustrating an example of a waveform processing circuit in which plural sets of the integration circuit, the reference signal output circuit, and the comparison circuit are provided and the waveform generating circuit is shared.

FIG. 10 shows an example of the waveform processing circuit 1 in which a group $G_1$ of an integration circuit 111, a reference signal output circuit 121, and a comparison circuit 131, a group $G_2$ of an integration circuit 112, a reference signal output circuit 122, and a comparison circuit 132, and a group $G_3$ of an integration circuit 113, a reference signal output circuit 123, and a comparison circuit 133 are provided and the waveform generating circuit 14 is used in common. In the waveform processing circuit 1 shown in FIG. 10, different pulses (the signals $S_{41}$, $S_{42}$, and $S_{43}$ from the comparison circuit elements $CE_1$, $CE_2$, and $CE_3$) are generated from the groups $G_1$, $G_2$, and $G_3$ and the waveform generating circuit 14 generates a proper waveform from the generated signals and the input pulse signal $S_1$. The waveform processing circuit shown in FIG. 10 is the same as the waveform generating circuit (a combination of FIGS. 6 and 8) in which the integration circuit 11, the reference signal output circuit 12, and the comparison circuit 13 each include three elements and the waveform generating circuit 14 receives the pulse signal $S_1$.

Figure 11:
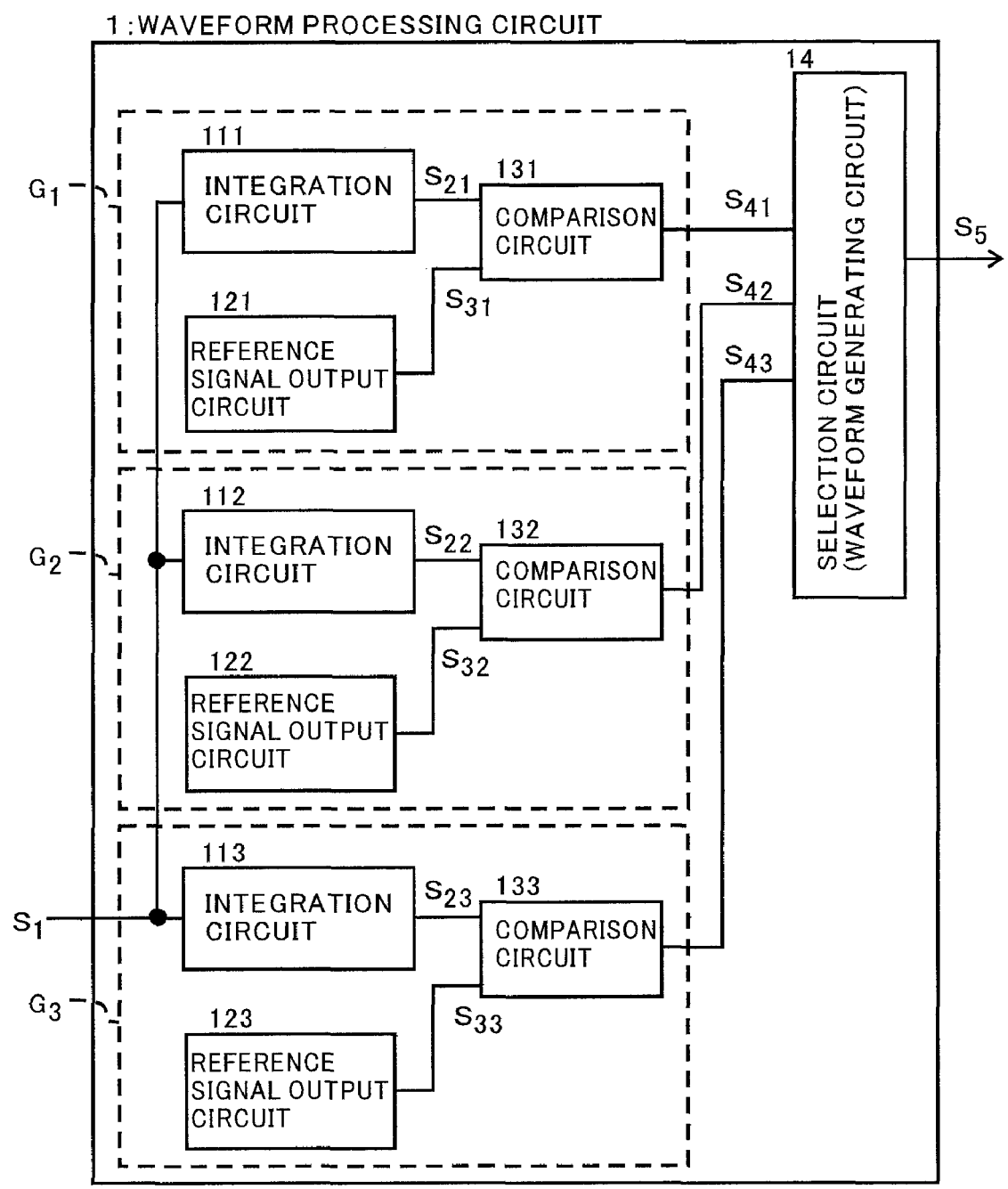
FIG. 11 is a diagram illustrating another example of the waveform processing circuit in which plural sets of the integration circuit, the reference signal output circuit, and the comparison circuit are provided and the waveform generating circuit is shared.

FIG. 11 is a diagram illustrating an example where the waveform processing circuit 1 shown in FIG. 10 does not receive the input pulse signal $S_1$. In the waveform processing circuit shown in FIG. 11, different pulses ($S_{41}$, $S_{42}$, and $S_{43}$ from the comparison circuit elements $CE_1$, $CE_2$, and $CE_3$) are generated from the groups $G_1$, $G_2$, and $G_3$, and a proper waveform $S_5$ is generated on the basis of the generated signals by the waveform generating circuit 14. The waveform processing circuit shown in FIG. 11 is the same as the waveform generating circuit (a combination of FIGS. 7 and 9) in which the integration circuit 11, the reference signal output circuit 12, and the comparison circuit 13 each include three elements and the waveform generating circuit 14 does not receive the pulse signal $S_1$.

Figure 12:
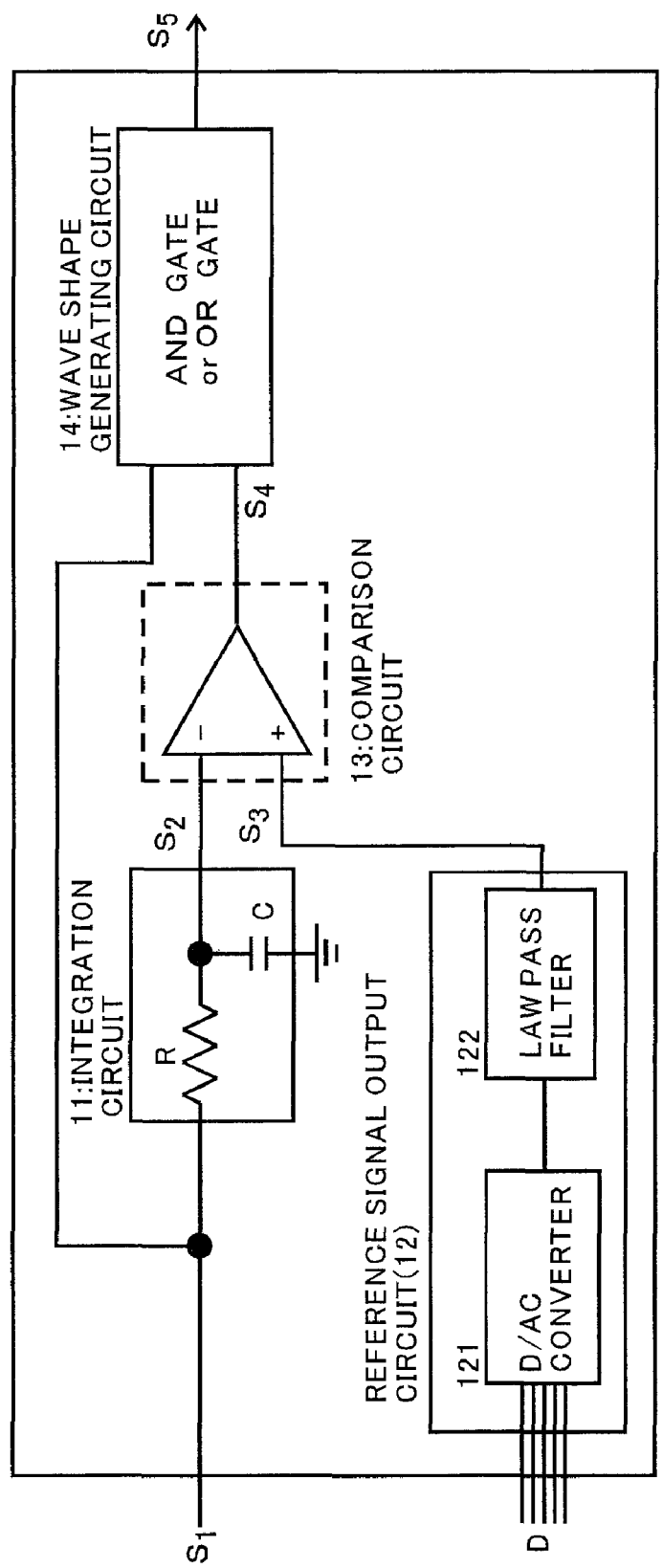
FIG. 12 is a diagram illustrating a specific example of the waveform processing circuit used in the invention.

FIG. 12 is a diagram specifically illustrating the waveform processing circuit 1 shown in FIG. 1.

In this embodiment, the integration circuit 11 includes a CR circuit, the reference signal output circuit 12 includes a D/A converter 121 and a low-pass filter 122, the comparison circuit 13 includes an analog amplifier (OP AMP), and the waveform generating circuit 14 includes an AND circuit (or an OR circuit). A driver circuit (charge switch) or a discharge circuit (a discharge resistor and a discharge switch) of the integration circuit 11 is omitted in the drawing.

Figure 13A:
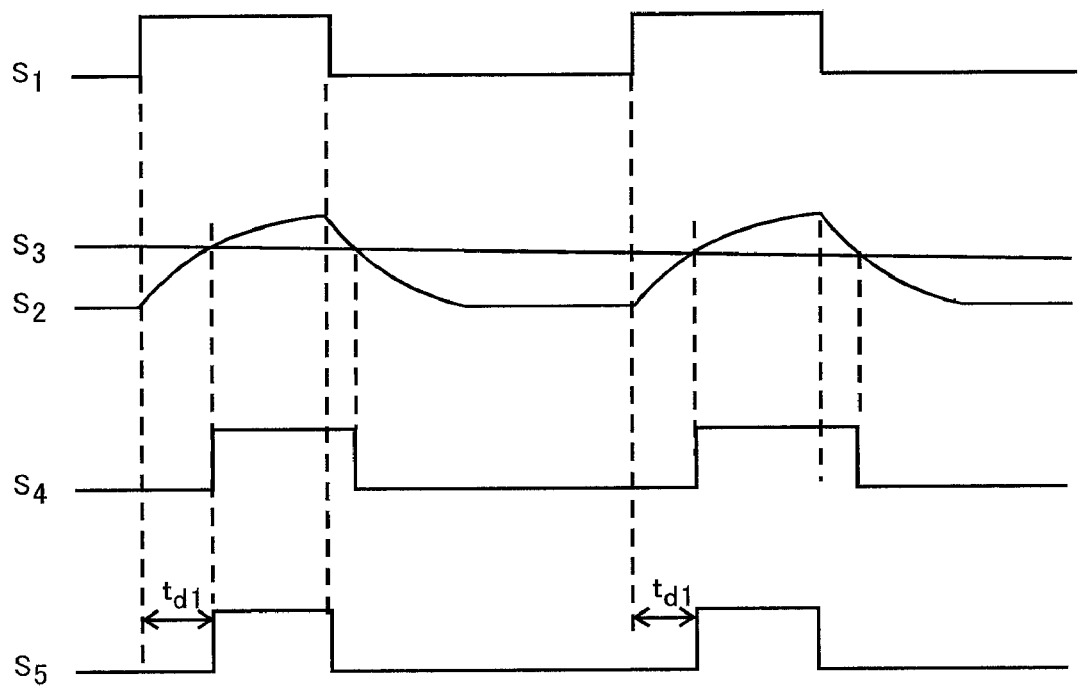
FIG. 13(A) shows an example where the waveform generating circuit is an AND circuit and FIG. 13(B) shows an example where the waveform generating circuit is an OR circuit.
Figure 13B:
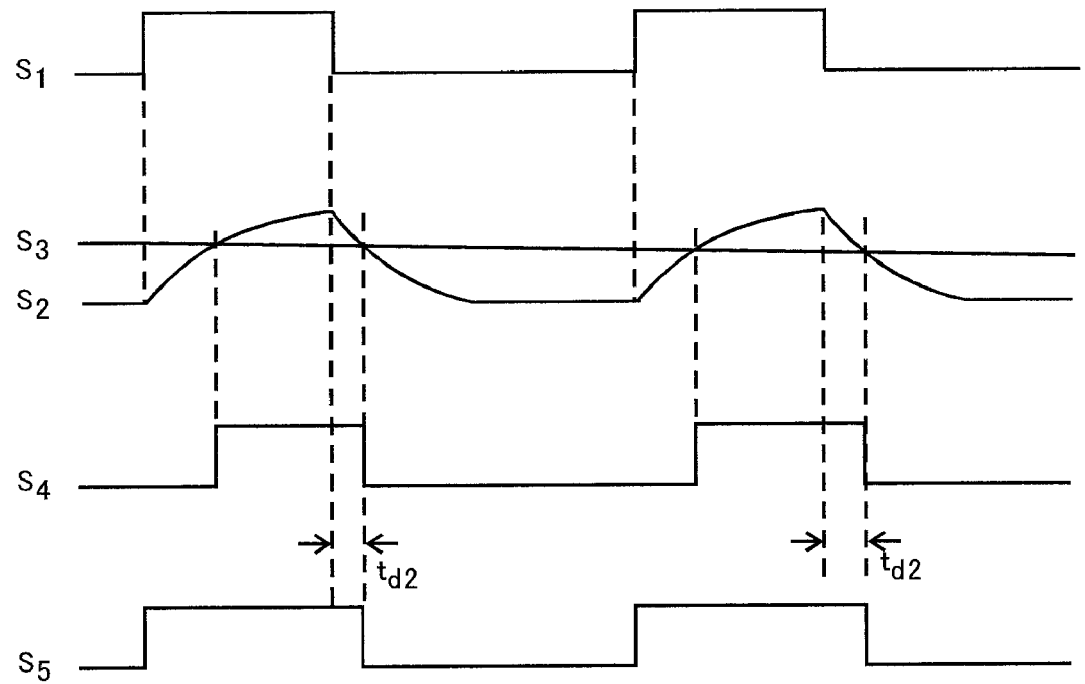

Examples of operation waveforms of the waveform processing circuit 1 shown in FIG. 8 or 9 are shown in FIGS. 13(A) and 13(B). FIG. 13(A) shows an example where the waveform generating circuit 14 includes an AND circuit and FIG. 13(B) shows an example where the waveform generating circuit 14 is an OR circuit.

In a system sufficiently operating with basic clock frequencies used to generate the pulse signal $S_1$, the above-mentioned waveform processing circuit is not effective greatly. Due to the delay $t_{d1}$ of $S_5$ in FIG. 13(A) resulting from the waveform processing circuit 1 and the delay $t_{d2}$ of $S_5$ in FIG. 13(B), the rising edge (FIG. 13(A)) and the falling edge (FIG. 13(B)) of $S_5$ can be generated as if a clock higher in frequency than the basis clock is used.

Figure 14A:
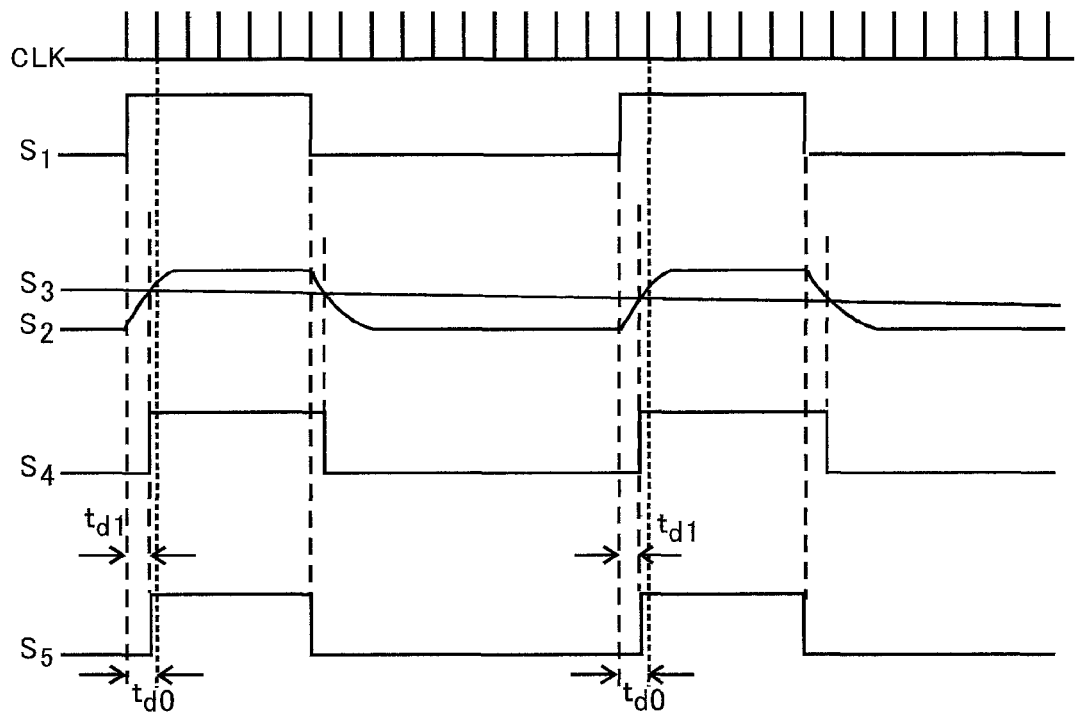
FIG. 14(A) shows an example where the waveform generating circuit is an AND circuit and FIG. 14(B) shows an example where the waveform generating circuit is an OR circuit.
Figure 14B:
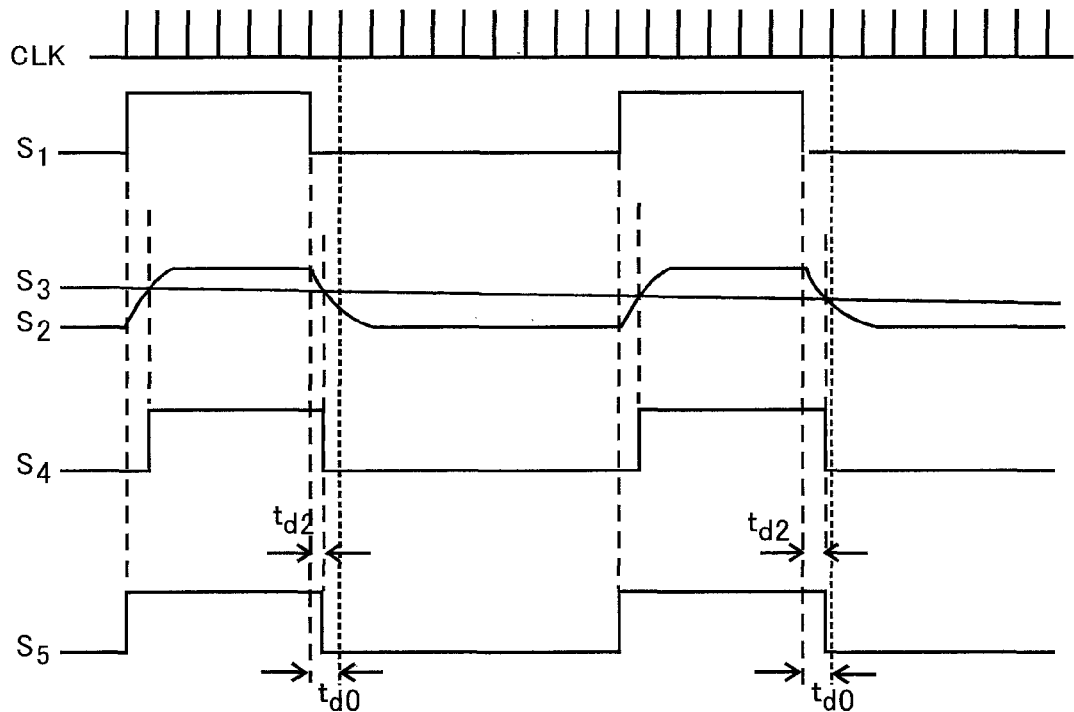

FIGS. 14(A) and 14(B) show examples of operation waveforms for generating a timing signal with a resolution higher than that of the basic clock CLK used to generate the pulse signal $S_1$. FIG. 14(A) shows an example where the waveform generating circuit 14 includes an AND circuit and FIG. 14(B) shows an example where the waveform generating circuit 14 is an OR circuit. Since the delay $t_{d1}$ of the rising edge of $S_5$ in FIG. 14(A) can be set shorter than the period $t_{d0}$ of the clock CLK and the delay $t_{d1}$ of the falling edge of $S_5$ in FIG. 14(B) can be set shorter than the period $t_{d0}$ of the clock CLK, it is possible to perform substantially the same process as using a clock higher than the clock CLK.

Figure 15:
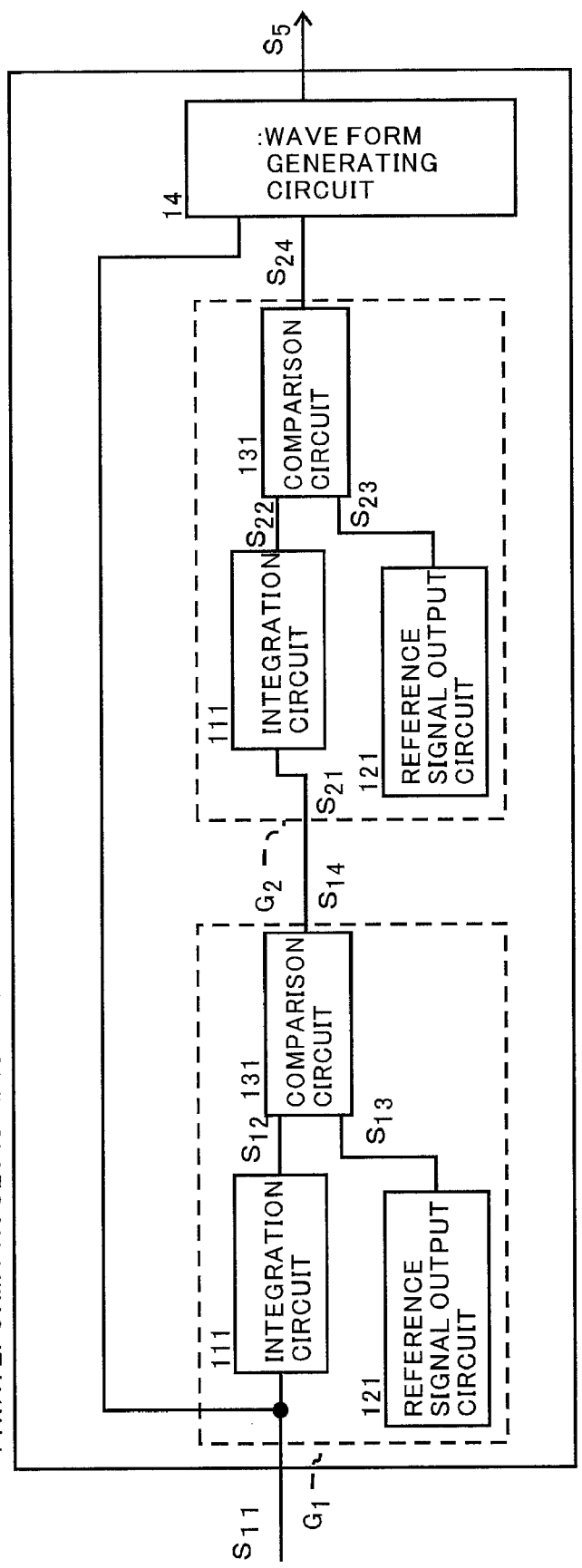
FIG. 15 is a diagram illustrating an embodiment of the waveform processing circuit including plural sets of the integration circuit, the reference signal output circuit, and the comparison circuit connected in series.
Figure 16:
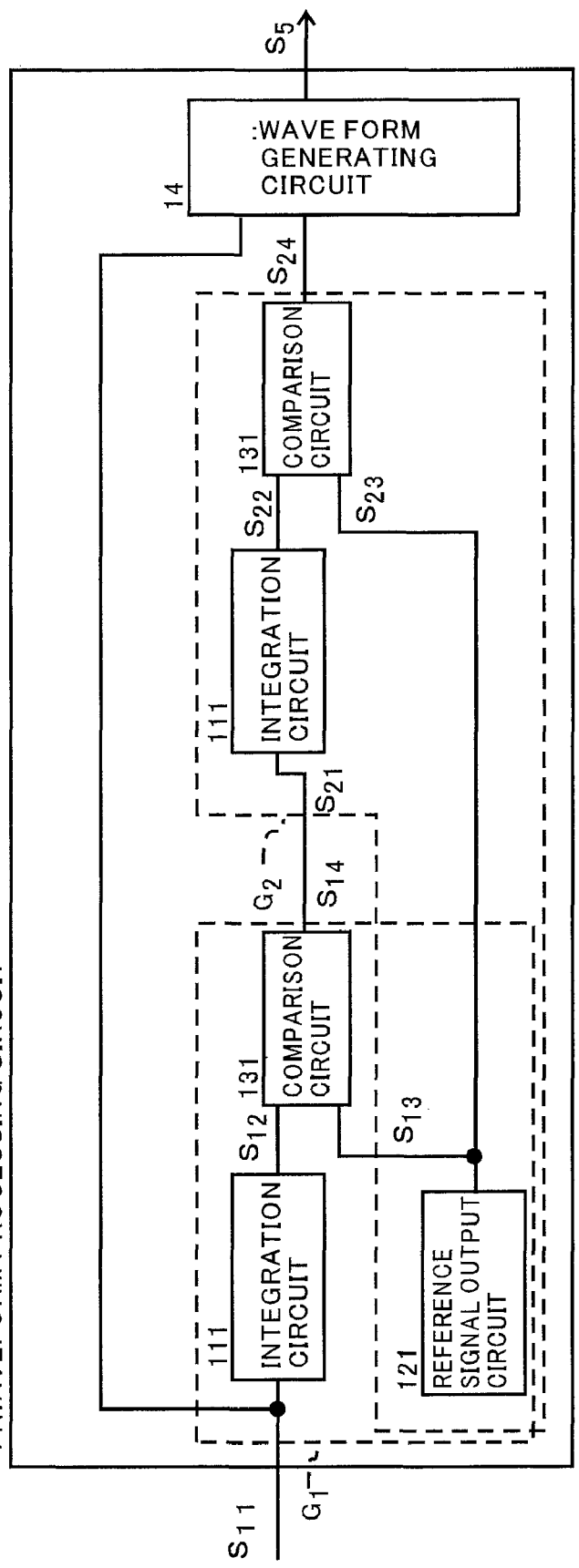
FIG. 16 is a diagram illustrating an embodiment where the reference signal output circuit is shared in the waveform processing circuit shown in FIG. 15.

FIG. 15 is a diagram illustrating an embodiment where plural groups of an integration circuit, a reference signal output circuit, and a comparison circuit are provided in the waveform processing circuit. In the waveform processing circuit 1 shown in FIG. 15, two groups $G_1$ and $G_2$ of the integration circuit 111, the reference signal output circuit 121, and the comparison circuit 131 are connected in series and the waveform generating circuit 14 is provided at the subsequent stage of the group $G_2$. The waveform generating circuit 14 acquires the input $S_{11}$ of the group $G_1$ and the input $S_{24}$ of the group $G_2$ and generates a proper waveform $S_5$ on the basis of the acquired signals. FIG. 16 shows an embodiment where the reference signal output circuit 121 is shared in $G_1$ and $G_2$.

The time constant of the integration circuit 111 in the group $G_2$ is greater than the time constant of the integration circuit 111 in the group $G_2$.

Accordingly, a fine edge timing of the group $G_1$ is generated and a finer edge timing of the group $G_2$ is generated.

Figure 17:
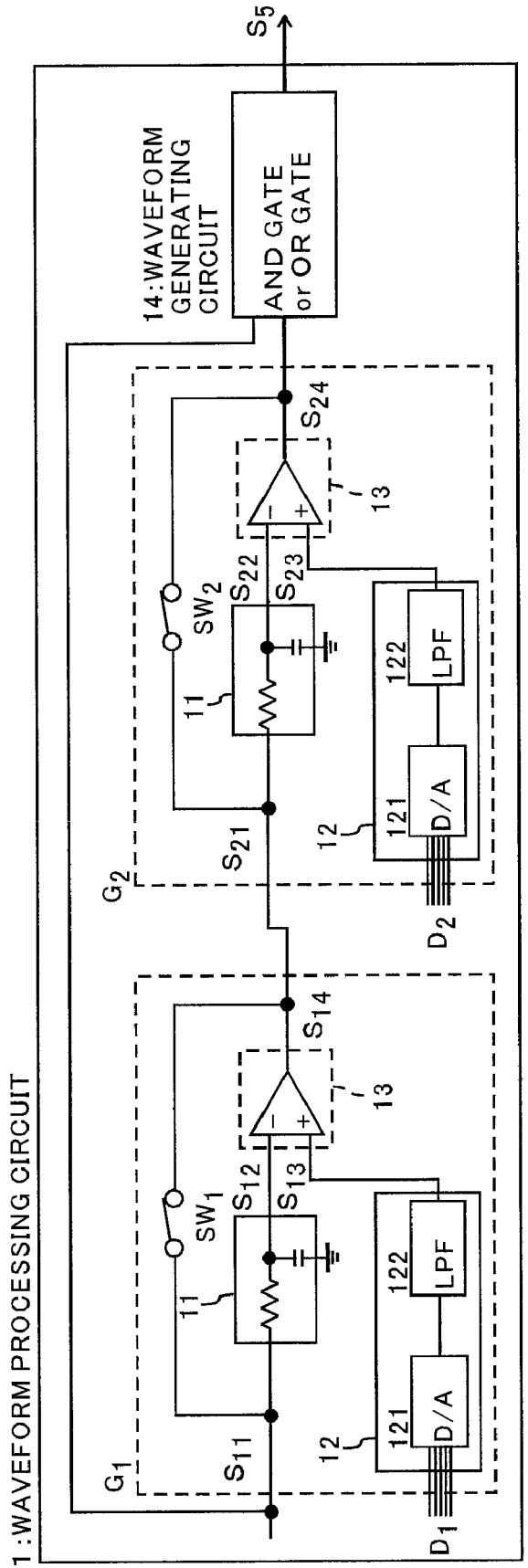
FIG. 17 is a diagram illustrating a specific example of the waveform processing circuit shown in FIG. 15.

FIG. 17 is a circuit diagram specifically illustrating the waveform processing circuit 1 shown in FIG. 15. In the waveform processing circuit 1 shown in FIG. 15, the groups $G_1$ and $G_2$ each include switches $SW_1$ and $SW_2$ switching the serial connection of the integration circuit 111 and the reference signal output circuit 121 and can select one of the serial connections of the groups $G_1$ and $G_2$. A switching may be disposed in one of the groups $G_1$ and $G_2$. A driver circuit (driver switch) or a discharge circuit (a discharge resistor and a discharge switch) of each integration circuit 11 of $G_1$ and $G_2$ is omitted in the drawing.

Figure 18:
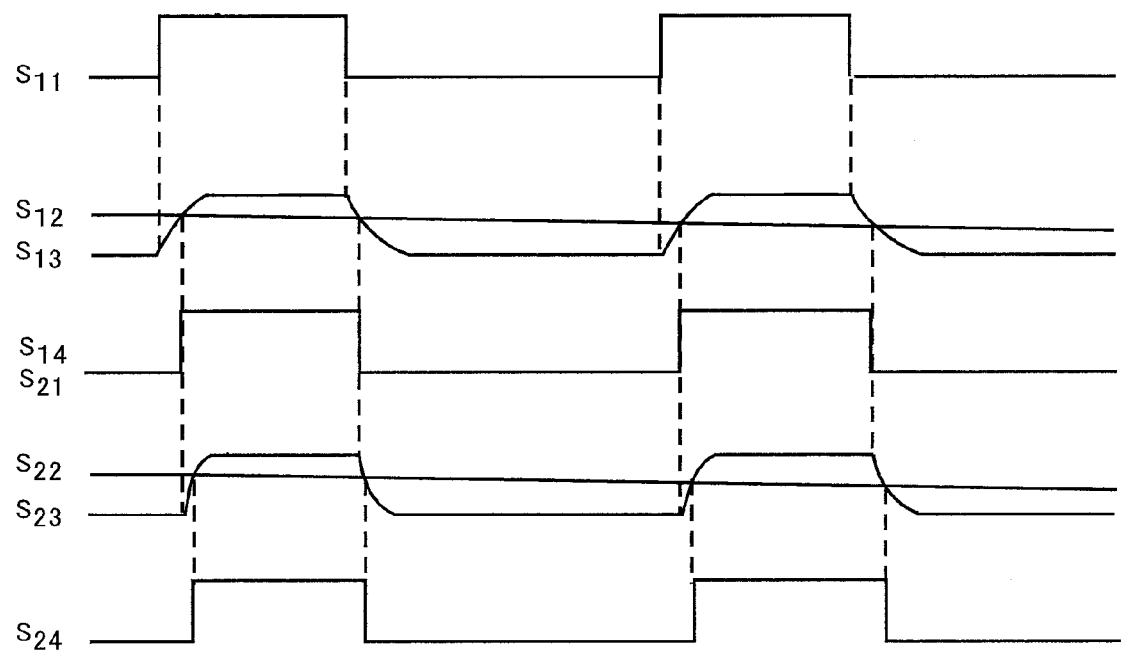
FIG. 18 is a diagram illustrating an example of operation waveforms of the waveform processing circuit shown in FIG. 17.

In the waveform processing circuit 1 according to this embodiment, as can be seen from the operation waveforms (the output of the waveform generating circuit 14 is not shown) of FIG. 18, the same edge (edge with the same precision) as using a clock higher than the basic clock is generated by the group $G_1$ of the integration circuit 111, the reference signal output circuit 121, and the comparison circuit 131 at the previous stage and the finer edge is obtained by the group $G_2$ of the integration circuit 111, the reference signal output circuit 121, and the comparison circuit 131 at the subsequent stage.

Figure 19:
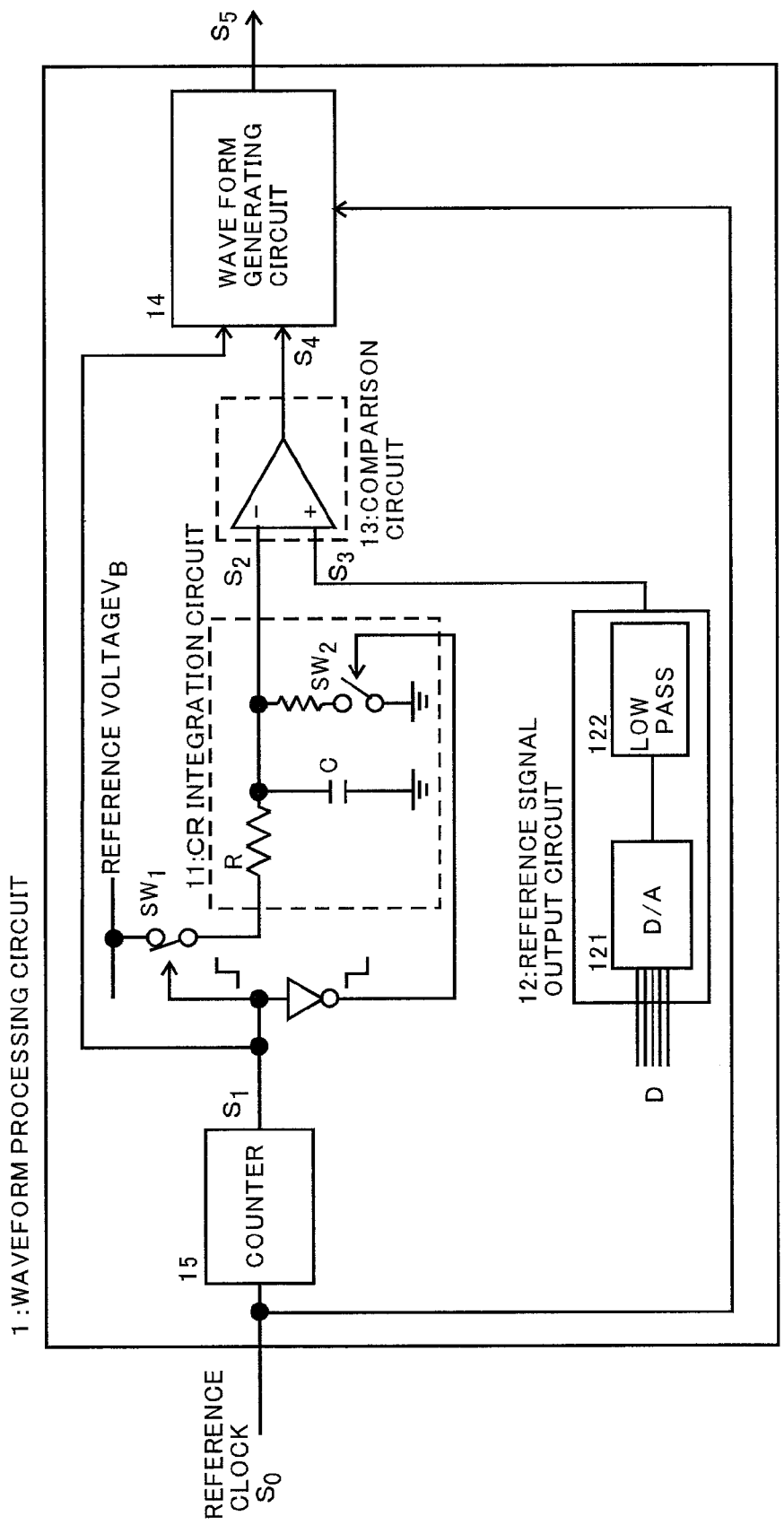
FIG. 19 is a diagram illustrating an embodiment where a counter circuit (counter) is provided at a front-stage of the integration circuit in the waveform processing circuit used in the invention, which shows a circuit for finely adjusting a rising timing and a falling timing of a carry signal.

FIG. 19 is a diagram illustrating an embodiment where a counter circuit (counter) is provided at a front-stage of the integration circuit in the waveform processing circuit used in the invention. The circuit shown in FIG. 19 can finely adjust the rising timing and the falling timing of the carry signal $S_1$.

In FIG. 19, the counter circuit 15 is provided at the front-stage of the CR integration circuit 11, and the output signal (carry signal) $S_1$ of the counter circuit 15 operates the charge switch $SW_1$ and the discharge switch $SW_2$. The counter circuit 15 receives the reference clock $S_0$. When receiving a pulse corresponding to the preset value, the counter circuit 15 outputs the carry signal $S_1$.

Figure 20A:
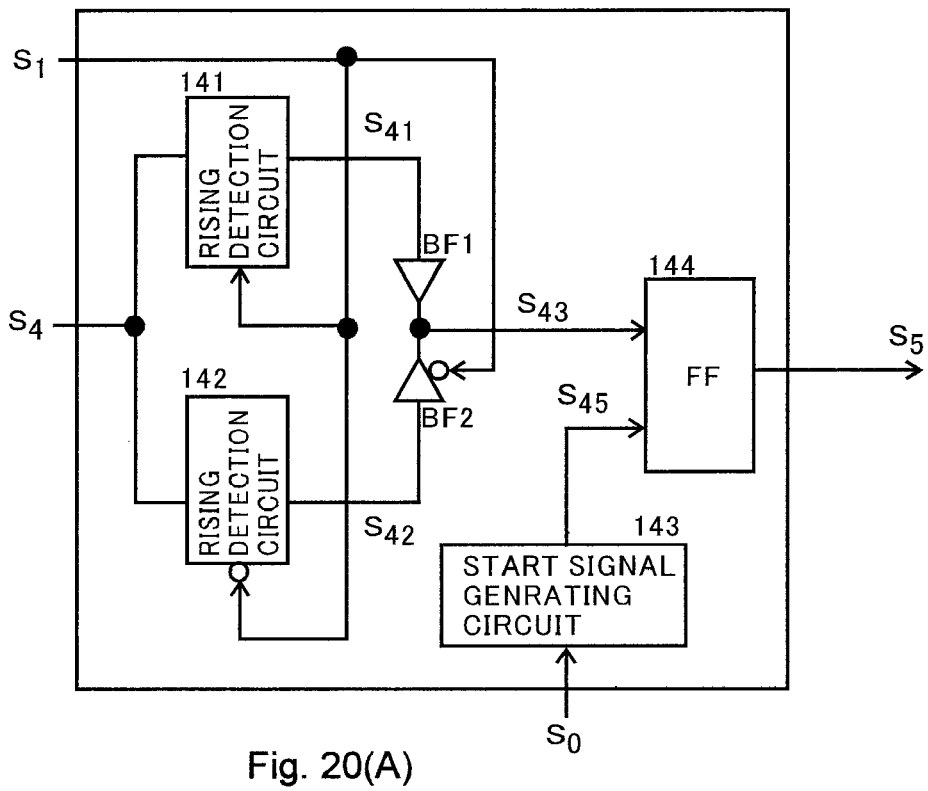
FIG. 20(A) is a diagram illustrating the waveform generating circuit used in FIG. 19.

FIG. 20(A) shows the waveform generating circuit 14 used in FIG. 19. In FIG. 20(A), the waveform generating circuit 14 includes rising detection circuits 141 and 142, start signal generating circuit 143, a flip-flop (FF) 144, and buffer circuits BU1 and BU2.

Figure 20B:
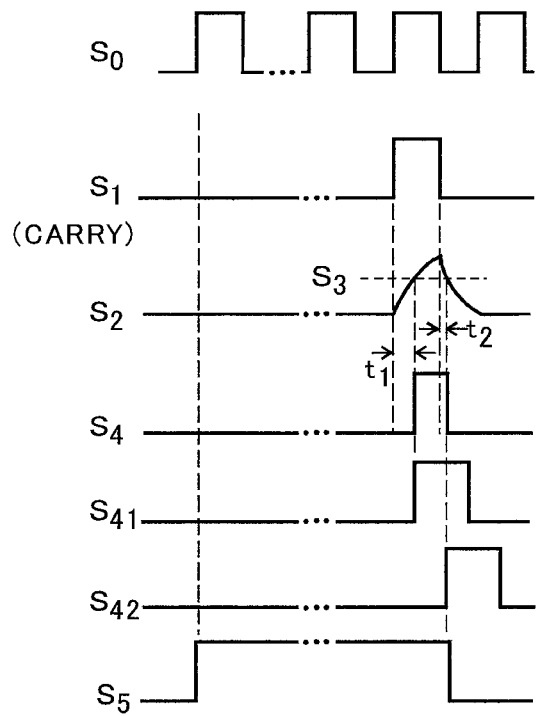
FIG. 20(B) is a diagram illustrating an operation waveform.

FIG. 20(B) shows operation waveforms ($S_0$, $S_1$, $S_2$, $S_3$, $S_4$, $S_{41}$, $S_{42}$, $S_5$) of each part of the waveform generating circuit 14.

Figure 21:
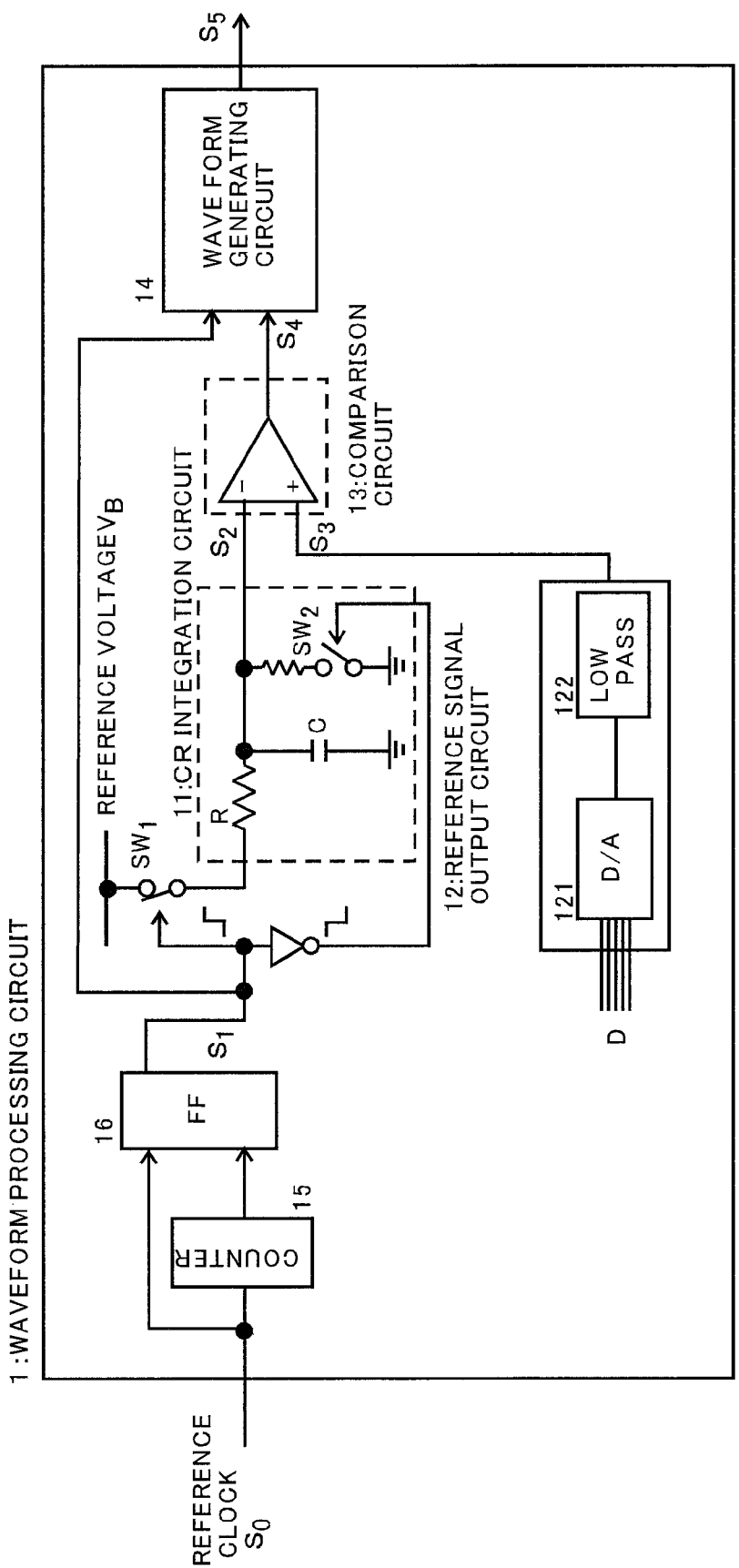
FIG. 21 is a diagram illustrating another embodiment where a counter circuit (counter) is provided at a front-stage of the integration circuit in the waveform processing circuit used in the invention, which shows a circuit capable of finely adjusting the rising timing of a carry signal.
Figure 22A:
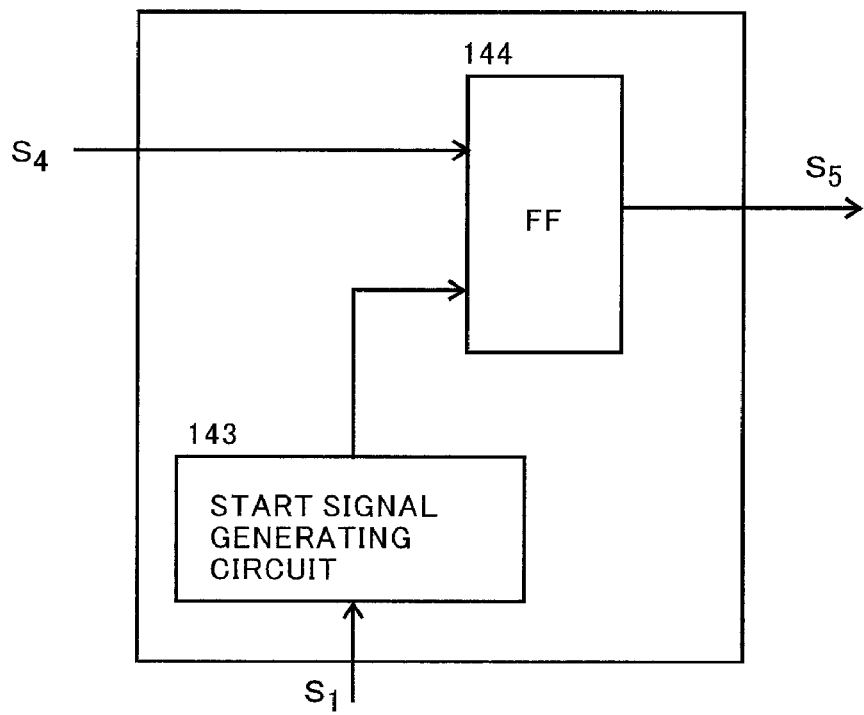
FIG. 22(A) is a diagram illustrating the waveform generating circuit used in FIG. 22.
Figure 22B:
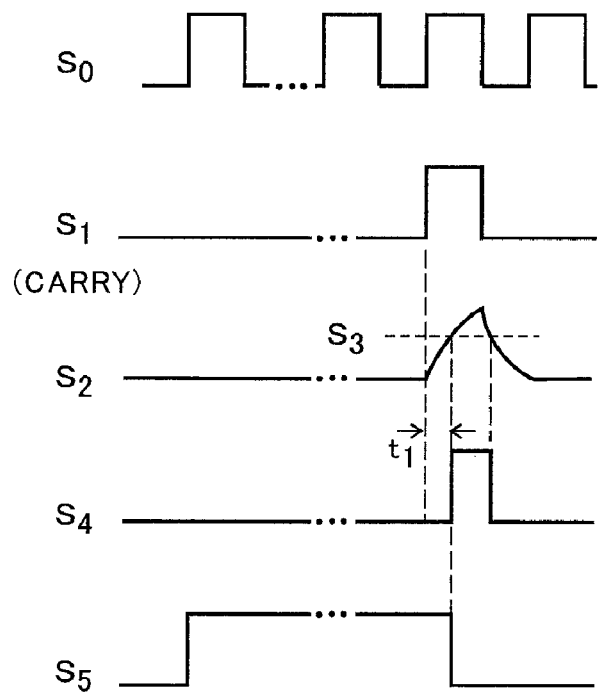
FIG. 22(B) is a diagram illustrating an operation waveform.
Figure 23:
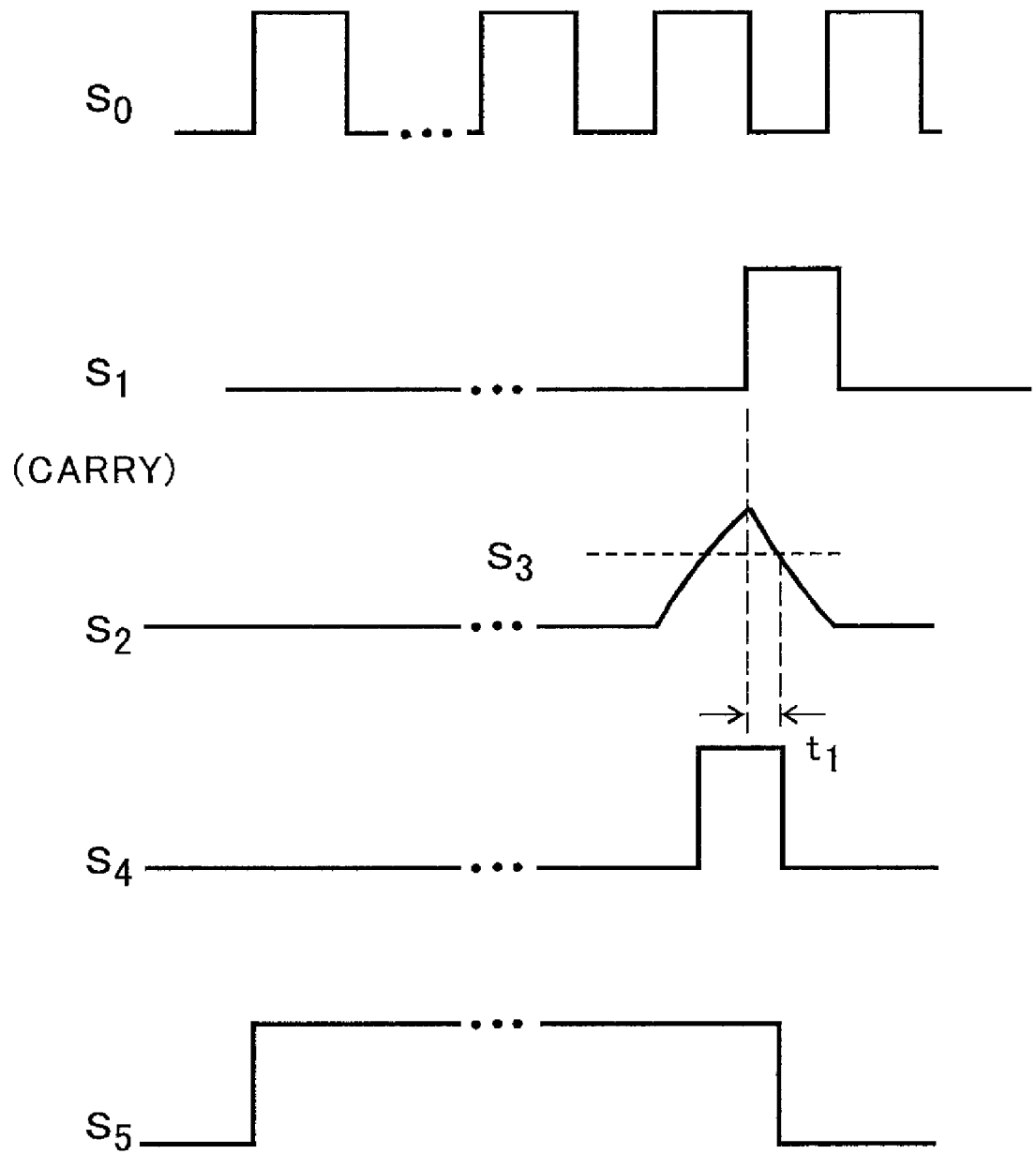
FIG. 23 is a waveform diagram illustrating a fine adjustment of the rising timing of a carry signal.

FIG. 21 is a diagram illustrating another embodiment where a counter circuit (counter) is provided at a front-stage of the integration circuit in the waveform processing circuit used in the invention. The circuit shown in FIG. 21 can finely adjust the rising timing of the carry signal $S_1$. In FIG. 21, the FF 16 is provided at the front-stage of the integration circuit 11, and the FF 16 receives the carry signal of the counter 15 and the reference clock. FIG. 22(A) shows the waveform generating circuit 14 used in the circuit shown in FIG. 21, which includes a start signal generating circuit 143 and the FF 144. FIG. 22(B) shows the operation waveform of the waveform processing circuit 1 (the waveform generating circuit 14 shown in FIG. 22(A)) shown in FIG. 21. Further, as shown in the waveform diagram of FIG. 23, the waveform processing circuit 1 may be configured by finely adjusting the rising of the carry signal S1.

Figure 24:
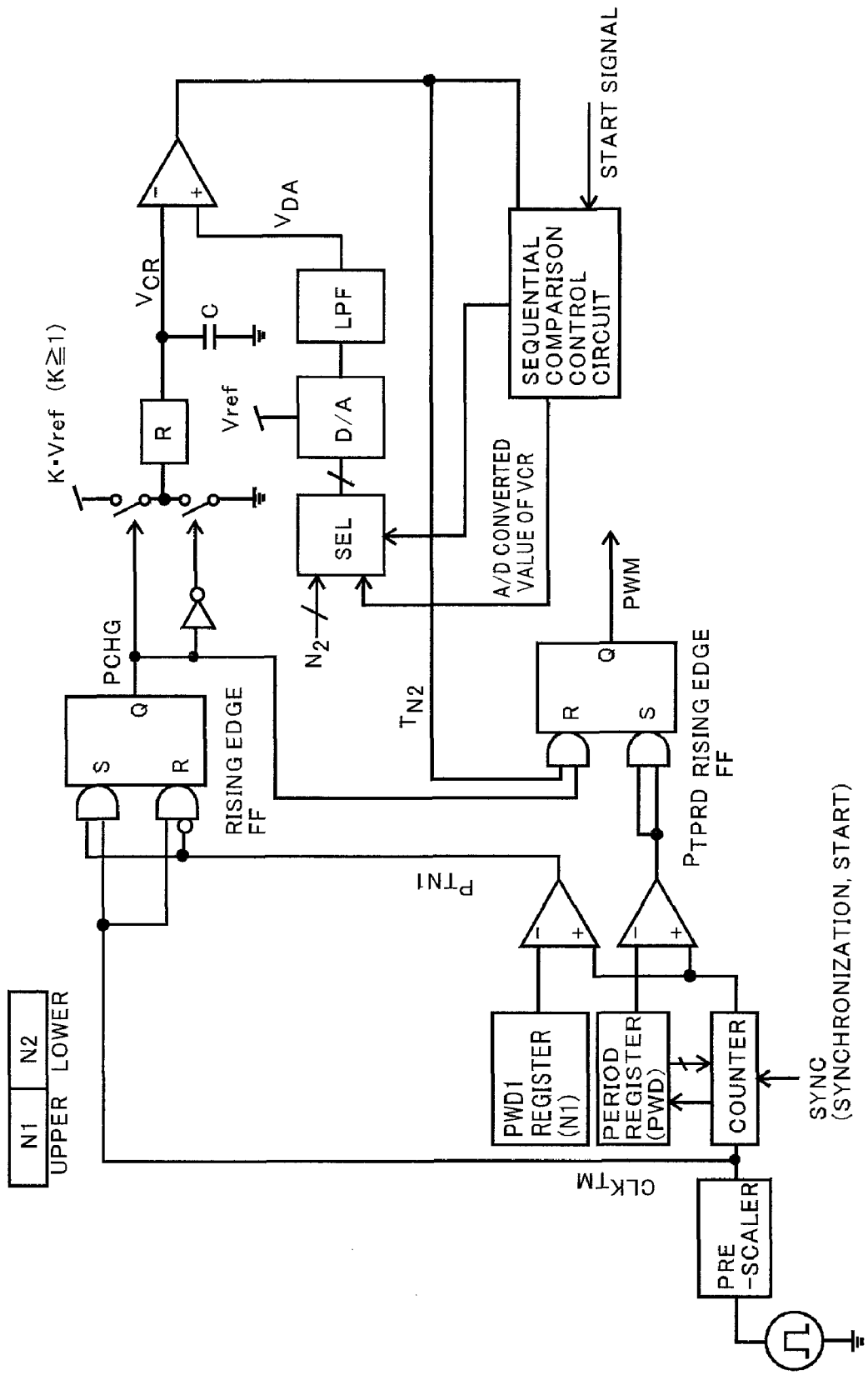
FIG. 24 is a diagram illustrating an embodiment in detail according to the invention.
Figure 25:
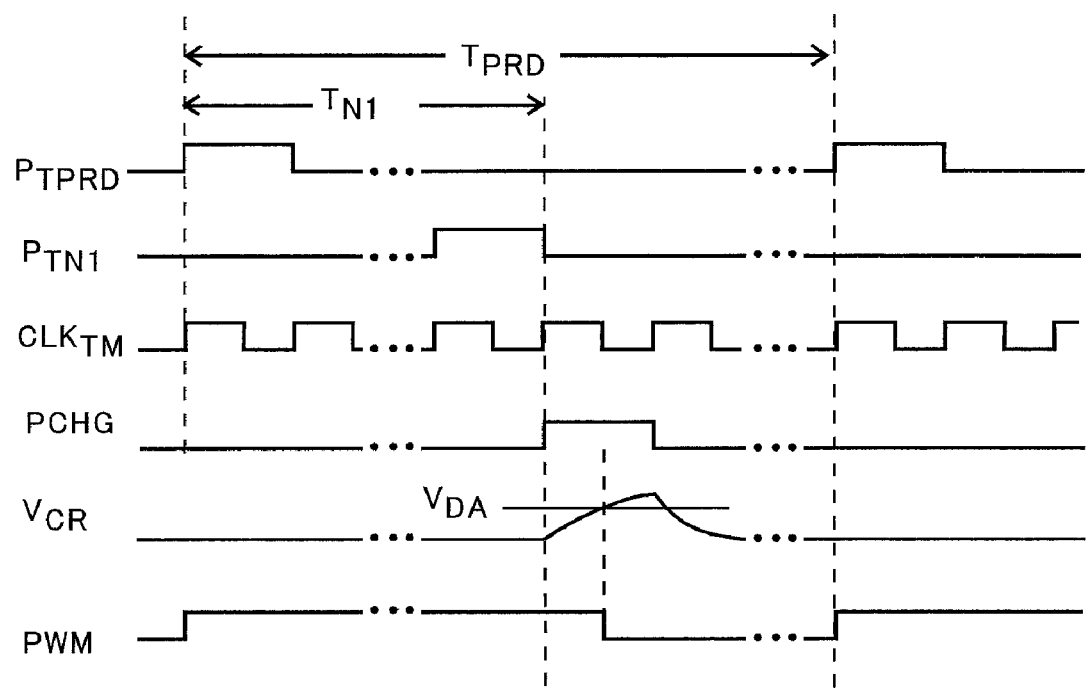
FIG. 25 is a diagram illustrating an operation waveform of each part shown in FIG. 24.

FIG. 24 is a diagram illustrating an embodiment in detail according to the invention. FIG. 25 is a diagram illustrating an operation waveform of each part shown in FIG. 24.

Figure 26A:
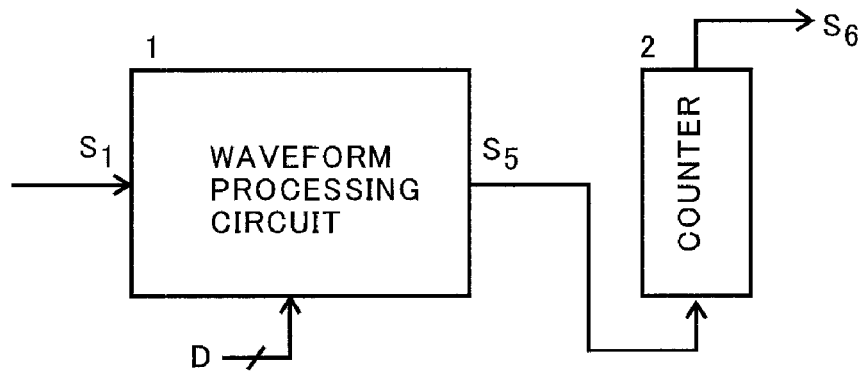
FIG. 26(A) is a diagram illustrating the waveform processing circuit which is further provided with a counter circuit at the back-stage of the waveform processing circuit.
Figure 26B:
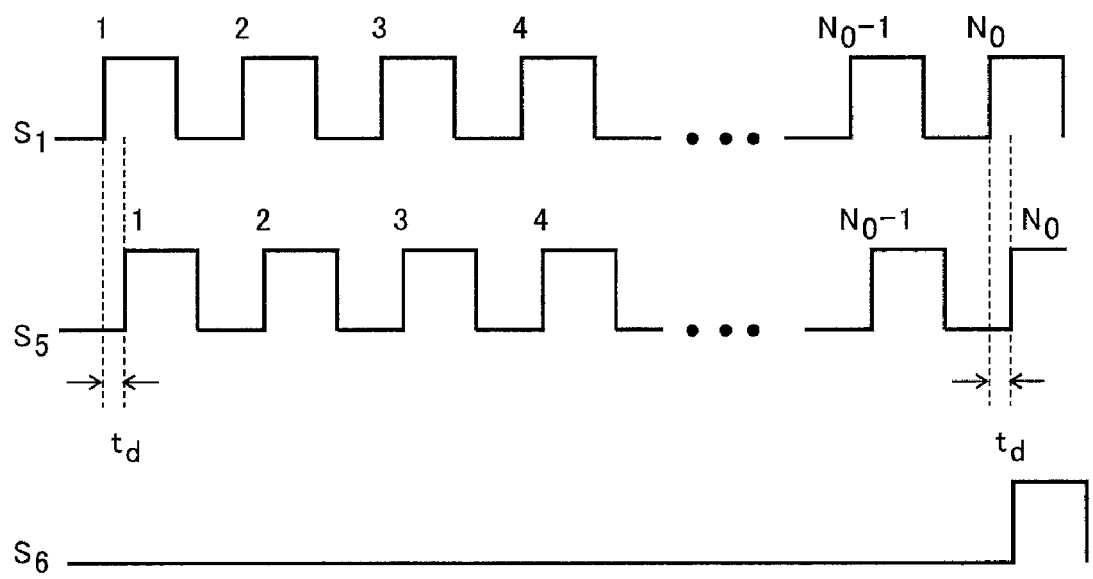
FIG. 26(B) is a timing diagram illustrating an operation of the waveform processing circuit 2.
Figure 27A:
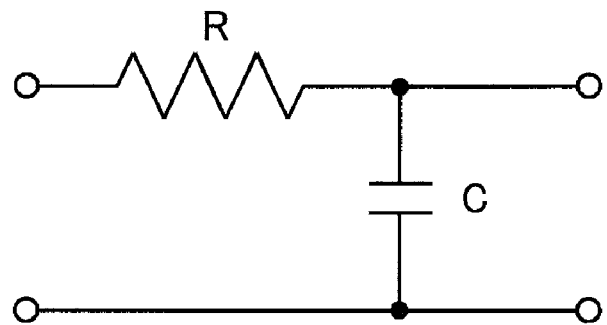
FIG. 27(A) is a diagram an RC integration circuit, (B) is a waveform diagram illustrating an operation when a capacitor is charged in advance, and (C) is an enlarged view illustrating a part of the waveform shown in (B).
Figure 27B:
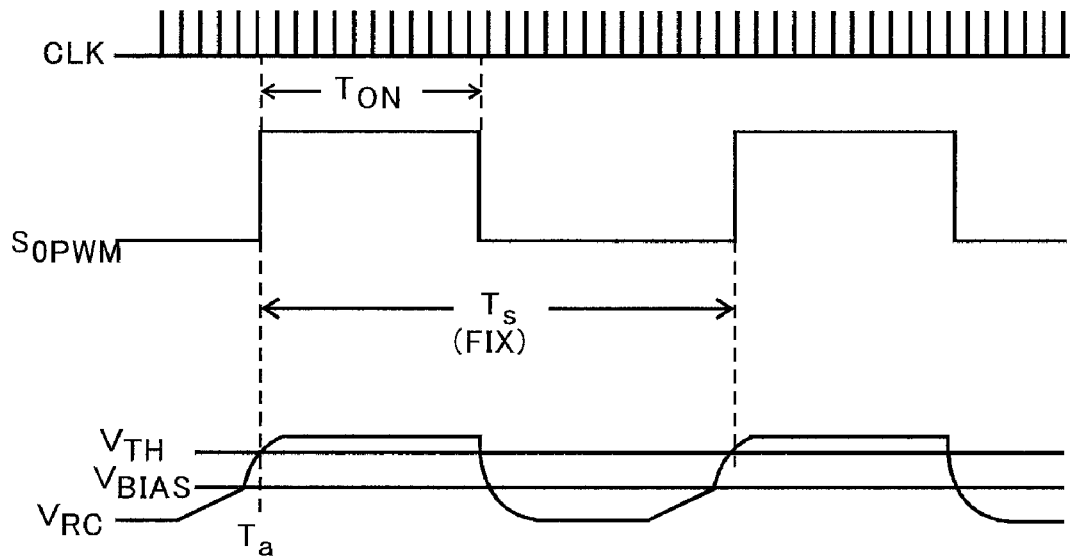
FIG. 27 is a diagram illustrating the related art.
Figure 27C:
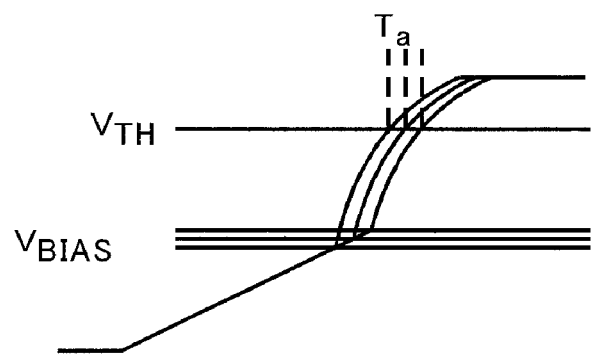
Figure 28A:
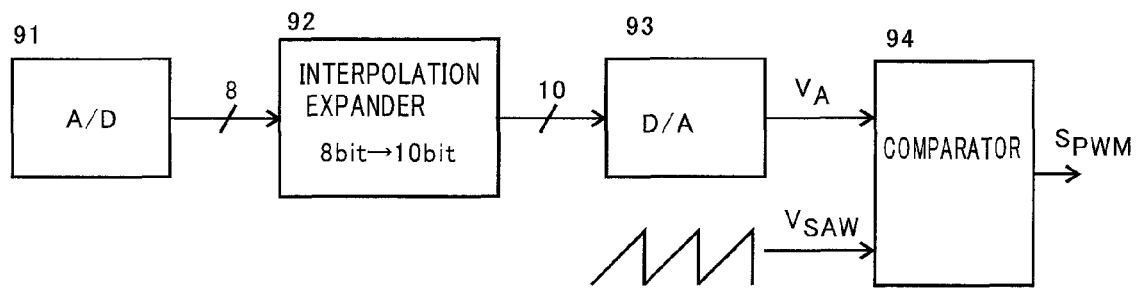
FIG. 28(A) is a diagram illustrating a circuit for increasing a frequency by interpolating and expanding the number of bits, and (B) is a diagram illustrating an operation of the circuit shown in (A).
Figure 28B:
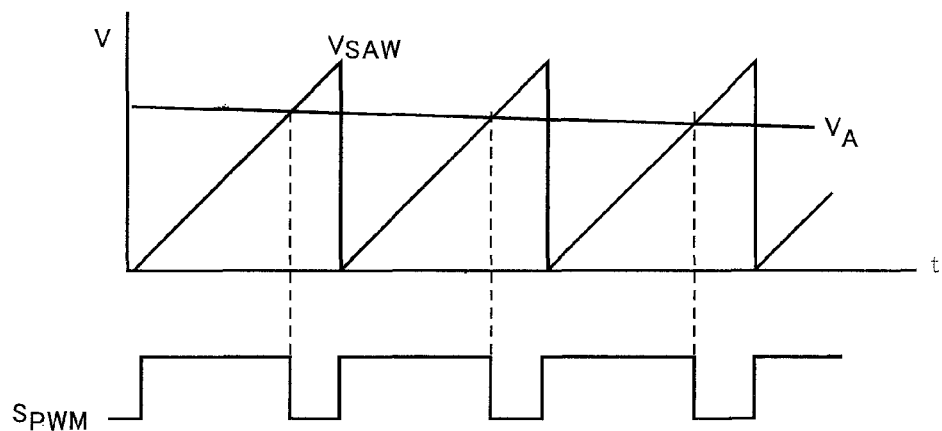

FIG. 26(A) is a diagram illustrating the waveform processing circuit which is further provided with a counter circuit 16 at the back-stage of the waveform processing circuit 1 of FIG. 1 or the like, and FIG. 26(B) is a timing diagram illustrating an operation of the waveform processing circuit 2. As shown in FIG. 26(B), a pulse signal is generated with a frequency lower than the pulse signal, and the turn-on or turn-off timing of a processing signal (not shown) can be generated.

The invention claimed is:

1. A pulse width adjusting circuit that changes ON or OFF time width, the pulse width adjusting circuit comprising:
    an integration circuit receiving a rectangular or substantially-rectangular pulse and outputting a gradually increasing or decreasing signal obtained by integrating the pulse signal;
    a reference signal output circuit outputting a constant value or a varying value as a reference signal; and
    a comparison circuit comparing the output of the integration circuit with the output of the reference signal output circuit and outputting a pulse rising or falling at a timing that magnitude relation between the outputs varies,
    wherein the reference signal output circuit includes a D/A converter and a low-pass filter is further provided at the subsequent stage of the D/A converter.

2. The pulse width adjusting circuit according to claim 1, wherein plural groups of the integration circuit, the reference signal output circuit, and the comparison circuit are provided in parallel and a selection circuit is provided at the subsequent stage of the comparison circuit.

3. The pulse width adjusting circuit according to claim 1, wherein plural groups of the integration circuit, the reference signal output circuit, and the comparison circuit are provided in series.

4. The pulse width adjusting circuit according to claim 1, wherein the integration circuit includes plural integration circuit elements and a selection circuit selecting the outputs of the integration circuit elements, and/or
    wherein the reference signal output circuit includes plural reference signal output circuit elements and a selection circuit selecting the outputs of the reference signal output circuit elements.

5. The pulse width adjusting circuit according to claim 1, wherein a plural number of the integration circuits is provided and the comparison circuit is provided on the output sides of the integration circuits, and
  wherein the plural comparison circuits compare the outputs of the plural integration circuits and the reference signal output circuit with each other.

6. The pulse width adjusting circuit according to claim 1, wherein a plural number of the reference signal output circuits is provided and the comparison circuit is provided on the output sides of the reference signal output circuits, and
  wherein the plural comparison circuits compare the outputs of the plural reference signal output circuits and the integration circuit with each other.

7. The pulse width adjusting circuit according to claim 1, wherein an output stage is provided with a waveform generating circuit synthesizing the rectangular or substantially-rectangular pulse signal and the output signal of the comparison circuit.

8. The pulse width adjusting circuit according to claim 1, wherein a counter circuit is further provided at the previous stage or the subsequent stage of the waveform generating circuit, and
  wherein a pulse signal of a frequency lower than that of the pulse signal is generated and a turning-on and/or turning-off timing signal of a processing pulse is generated.

* * * * *